US012153338B2

United States Patent
Shishido et al.

(10) Patent No.: US 12,153,338 B2
(45) Date of Patent: Nov. 26, 2024

(54) MASK BLANK, METHOD FOR MANUFACTURING TRANSFER MASK, AND METHOD FOR MANUFACTURING SEMICONDUCTOR DEVICE

(71) Applicant: HOYA CORPORATION, Tokyo (JP)

(72) Inventors: Hiroaki Shishido, Tokyo (JP); Ryo Ohkubo, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 172 days.

(21) Appl. No.: 17/438,194

(22) PCT Filed: Feb. 20, 2020

(86) PCT No.: PCT/JP2020/006732
§ 371 (c)(1),
(2) Date: Sep. 10, 2021

(87) PCT Pub. No.: WO2020/189168
PCT Pub. Date: Sep. 24, 2020

(65) Prior Publication Data
US 2022/0214608 A1 Jul. 7, 2022

(30) Foreign Application Priority Data
Mar. 18, 2019 (JP) ................................ 2019-050514

(51) Int. Cl.
*G03F 1/32* (2012.01)
(52) U.S. Cl.
CPC ..................................... *G03F 1/32* (2013.01)

(58) Field of Classification Search
CPC ..... G03F 1/32; G03F 1/80; G03F 1/38; G03F 1/50; G03F 1/54; G01N 23/2273
See application file for complete search history.

(56) References Cited

U.S. PATENT DOCUMENTS

| 11,281,089 B2 | 3/2022 | Nozawa et al. |
| 11,762,279 B2 | 9/2023 | Nozawa et al. |

(Continued)

FOREIGN PATENT DOCUMENTS

| CN | 102165375 A | 8/2011 |
| CN | 107430328 A | 12/2017 |

(Continued)

OTHER PUBLICATIONS

SG11202110115V, "Invitation to Respond to Written Opinion", Aug. 30, 2022, 9 pages.

(Continued)

*Primary Examiner* — Mark F. Huff
*Assistant Examiner* — Moriah S. Smoot
(74) *Attorney, Agent, or Firm* — Kilpatrick Townsend & Stockton LLP

(57) ABSTRACT

A mask blank 100 has a structure in which a pattern-forming thin film 3 and a hard mask film 4 are formed on a transparent substrate 1 in this order. An Si2p narrow spectrum obtained by analyzing the hard mask film by X-ray photoelectron spectroscopy has a maximum peak at a binding energy of at least 103 eV. An N1s narrow spectrum obtained by analyzing the hard mask film by X-ray photoelectron spectroscopy has a maximum peak below a detection lower limit value. In the hard mask film 4, a content ratio (atomic %) of silicon and oxygen is Si:O=1:less than 2.

14 Claims, 7 Drawing Sheets

(56) References Cited

U.S. PATENT DOCUMENTS

| | | |
|---|---|---|
| 2004/0185674 A1 | 9/2004 | M'Saad et al. |
| 2005/0019674 A1 | 1/2005 | Okubo et al. |
| 2007/0063221 A1* | 3/2007 | Wu .................. H01L 29/66636 |
| | | 257/E29.085 |
| 2008/0286662 A1 | 11/2008 | Okubo et al. |
| 2010/0173234 A1 | 7/2010 | Okubo et al. |
| 2011/0158683 A1 | 6/2011 | Okuda et al. |
| 2015/0086908 A1 | 3/2015 | Inazuki et al. |
| 2015/0338731 A1 | 11/2015 | Nozawa et al. |
| 2017/0023855 A1 | 1/2017 | Inazuki et al. |
| 2017/0038673 A1* | 2/2017 | Ikebe ...................... G03F 1/48 |
| 2017/0176848 A1* | 6/2017 | Shishido ............... G03F 7/2006 |
| 2018/0180985 A1 | 6/2018 | Kosaka et al. |
| 2018/0267398 A1 | 9/2018 | Irie et al. |
| 2018/0299767 A1 | 10/2018 | Nozawa et al. |
| 2018/0356721 A1 | 12/2018 | Kosaka et al. |
| 2019/0040516 A1 | 2/2019 | Ohkubo et al. |
| 2019/0146327 A1 | 5/2019 | Nozawa et al. |
| 2019/0265585 A1 | 8/2019 | Ikebe et al. |
| 2020/0064725 A1 | 2/2020 | Nozawa et al. |
| 2021/0109436 A1 | 4/2021 | Ohkubo et al. |
| 2021/0149294 A1 | 5/2021 | Nozawa et al. |
| 2022/0163880 A1 | 5/2022 | Nozawa et al. |
| 2023/0367196 A1 | 11/2023 | Nozawa et al. |

FOREIGN PATENT DOCUMENTS

| | | | |
|---|---|---|---|
| JP | 2009080510 A | 4/2009 | |
| JP | 2014232191 A * | 12/2014 | ............... G03F 1/26 |
| JP | 2016035546 A | 3/2016 | |
| JP | 6158460 B1 | 6/2017 | |
| JP | 2017134424 A * | 8/2017 | ............... G03F 1/32 |
| JP | 2017194588 A | 10/2017 | |
| JP | 2017223890 A | 12/2017 | |
| JP | 2017227824 A | 12/2017 | |
| JP | 2018106144 A | 7/2018 | |
| JP | 2019002973 A | 1/2019 | |
| KR | 101485754 B1 * | 1/2015 | |
| KR | 101567057 B1 * | 11/2015 | |
| TW | 201600919 A * | 1/2016 | ............... G03F 1/20 |
| TW | 201841043 A | 11/2018 | |
| TW | 201842402 A | 12/2018 | |
| WO | 2004/090635 A1 | 10/2004 | |
| WO | WO-2016140044 A1 * | 9/2016 | ............... G03F 1/26 |
| WO | WO-2017141605 A1 * | 8/2017 | ......... C23C 14/0057 |
| WO | 2018074512 A1 | 4/2018 | |

OTHER PUBLICATIONS

PCT/JP2020/006732, "English Translation of International Search Report", Apr. 14, 2020, 3 pages.

TW109107052, "Office Action", Aug. 16, 2023, 9 pages.

CN202080022142.1, "First Office Action" with machine translation, Dec. 26, 2023, 16 pages.

* cited by examiner

MASK BLANK, METHOD FOR MANUFACTURING TRANSFER MASK, AND METHOD FOR MANUFACTURING SEMICONDUCTOR DEVICE

CROSS-REFERENCE TO RELATED APPLICATIONS

This application is a National Stage of International Application No. PCT/JP2020/006732, filed Feb. 20, 2020, which claims priority to Japanese Patent Application No. 2019-050514, filed Mar. 18, 2019, and the contents of which is incorporated by reference.

TECHNICAL FIELD

This disclosure relates to a mask blank, a method for manufacturing a transfer mask using the mask blank, and a method for manufacturing a semiconductor device using the transfer mask manufactured from the mask blank.

BACKGROUND ART

As a mask blank for a halftone phase shift mask, there is already known a mask blank having a structure in which a halftone phase shift film made of a metal-silicide-based material, a light-shielding film made of a chromium-based material, and an etching mask film (hard mask film) made of an inorganic material are formed as layers on a transparent substrate (for example, see Patent Literature 1). In case where the phase shift mask is manufactured using the mask blank, at first, the etching mask film is patterned by dry etching using a fluorine-based gas and using, as a mask, a resist pattern formed on a surface of the mask blank. Next, the light-shielding film is patterned by dry etching using a gas mixture of chlorine and oxygen and using the etching mask film as a mask. Furthermore, the phase shift film is patterned by dry etching using a fluorine-based gas and using a pattern of the light-shielding film as a mask.

PRIOR ART LITERATURE(S)

Patent Literature(s)

Patent Literature 1: WO 2004/090635 A1
Patent Literature 2: JP 6158460 B

SUMMARY OF THE DISCLOSURE

Problem to be Solved by the Disclosure

In the mask blank as described in Patent Literature 1, the light-shielding film of a chromium-based compound is required to have a light-shielding function of decreasing a light quantity of exposure light transmitted through the phase shift film to a predetermined value or less. When the phase shift mask is manufactured from the mask blank, the pattern including a light-shielding zone is formed on the light-shielding film. A layered structure comprising the phase shift film and the light-shielding film is required to satisfy a predetermined optical density. Simultaneously, the light-shielding film is required to function as an etching mask when the phase shift film is patterned by the dry etching using the fluorine-based gas to form a phase shift pattern. At a stage of completion of the phase shift mask, a relatively sparse pattern such as a light-shielding pattern is generally formed on the light-shielding film. However, in the middle of manufacture of the phase shift mask from the mask blank, the light-shielding film must function as the etching mask when the phase shift pattern, which is a fine transfer pattern, is formed on the phase shift film. Therefore, it is desired that, in the light-shielding film also, a fine pattern can be formed with high dimensional accuracy.

In the dry etching of the light-shielding film made of the chromium-based material, a gas mixture of a chlorine-based gas and an oxygen gas (oxygen-containing chlorine-based gas) is used as an etching gas. Generally, the dry etching using the oxygen-containing chlorine-based gas as the etching gas has a low tendency toward anisotropic etching and a high tendency toward isotropic etching.

Generally, in case where a pattern is formed on a pattern-forming thin film by dry etching, not only etching in a film thickness direction but also etching in a sidewall direction of the pattern to be formed on the thin film, i.e., so-called side etching, progresses. In order to inhibit the progress of the side etching, it has already been practiced that, during the dry etching, a bias voltage is applied to a substrate on the side opposite from a main surface of the substrate that is provided with the thin film, thereby performing control such that a much more etching gas is brought into contact with the thin film in the film thickness direction. In case of ion-based dry etching using an etching gas, such as a fluorine-based gas, having a high tendency to generate ionic plasma, controllability of an etching direction by applying the bias voltage is high and anisotropy of etching is enhanced. Therefore, it is possible to minimize a side etching amount of the thin film to be etched.

On the other hand, in case of the dry etching using the oxygen-containing chlorine-based gas, the oxygen gas has a high tendency to generate radical plasma. Therefore, an effect of controlling the etching direction by applying the bias voltage is small and anisotropy of the etching is difficult to enhance. Accordingly, when the pattern is formed on the light-shielding film made of the chromium-based material by the dry etching using the oxygen-containing chlorine-based gas, the side etching amount tends to increase.

In case where the light-shielding film of the chlorine-based material is patterned by the dry etching using the oxygen-containing chlorine-based gas and using the resist pattern made of an organic material as an etching mask, the resist pattern is etched from above to decline. At that time, the resist pattern is etched to decline also in the sidewall direction. Therefore, a width of the pattern to be formed on a resist film is designed in anticipation of a declining amount due to the side etching. Furthermore, the width of the pattern to be formed on the resist film is designed also in anticipation of the side etching amount of the light-shielding film of the chromium-based material.

In recent years, a mask blank has begun to be used which is provided with an etching mask film (hard mask film) formed on a light-shielding film of a chromium-based material and made of a material having a sufficient etching selectivity over the chromium-based material with respect to dry etching using an oxygen-containing chlorine-based gas. In the mask blank, a pattern is formed on the hard mask film by dry etching using a resist pattern as a mask. Then, using, as a mask, the hard mask film provided with the pattern, the light-shielding film is dry etched using the oxygen-containing chlorine-based gas to form a pattern on the light-shielding film. Generally, the hard mask film is formed of a material which can be patterned by dry etching using a fluorine-based gas. The dry etching using the fluorine-based gas is ion-based etching and, therefore, has a high tendency toward anisotropic etching. Accordingly, in the hard mask film provided with the pattern, a side etching amount of a pattern sidewall is small. In case of the dry etching using the fluorine-based gas, the side etching amount tends to be small also in the resist pattern for forming the pattern on the hard mask film. Therefore, for the light-shielding film of the chromium-based material also, it is desired that the side etching amount is small in the dry etching using the oxygen-containing chlorine-based gas.

As means for reducing the side etching amount in the light-shielding film of the chromium-based material, it is considered to significantly increase, in the dry etching using the oxygen-containing chlorine-based gas, a mixing ratio of a chlorine-based gas in the oxygen-containing chlorine-based gas. This is because the chlorine-based gas has a high tendency to generate ionic plasma. In the dry etching using the oxygen-containing chlorine-based gas with an increased ratio of the chlorine-based gas, an etching rate of the light-shielding film of the chromium-based material inevitably decreases. In order to supplement the decrease in etching rate of the light-shielding film of the chromium-based material, it is also considered to significantly increase a bias voltage applied during the dry etching. Hereinafter, the dry etching, which uses the oxygen-containing chlorine-based gas with an increased ratio of the chlorine-based gas and which is performed under a condition where a high bias voltage is applied, will be called "high-bias etching with the oxygen-containing chlorine-based gas".

The etching rate of the light-shielding film of the chromium-based material by the high-bias etching with the oxygen-containing chlorine-based gas has a comparable level to that in dry etching under a conventional etching condition. The side etching amount of the light-shielding film during the etching can also be reduced as compared with that in the past.

Furthermore, by examining and adjusting bonds and compositions in the light-shielding film of the chromium-based material, it is possible to considerably reduce the side etching amount of the pattern formed on the light shielding film in case where the light-shielding film is patterned using, as a mask, the hard mask film with the pattern formed thereon, using the oxygen-containing chlorine-based gas as an etching gas, and under a high-bias etching condition. As a result, a fine pattern can be formed on the phase shift film with high accuracy (Patent Literature 2).

However, the pattern to be formed on the phase shift film is required to be further miniaturized. For this purpose, only the above-mentioned technique of considerably reducing the side etching amount of the pattern of the light-shielding film is not sufficient. Also, the pattern to be formed on the pattern-forming thin film such as the light-shielding film and the pattern to be formed on the hard mask film are required to be further miniaturized and to be improved in pattern quality. These matters also apply to a binary mask having a light-shielding film as a pattern-forming thin film and a reflective mask having an absorber film or the like as a pattern-forming thin film.

In order to solve the above-mentioned problems, this disclosure relates to a mask blank having a structure in which a pattern-forming thin film, such as a light-shielding film, and a hard mask film are formed as layers on a substrate in this order, and aims to provide a mask blank which is capable of achieving further miniaturization and pattern quality improvement of a pattern to be formed on a pattern-forming thin film, such as a light-shielding film, and a pattern to be formed on a hard mask film.

In particular, it is an aspect of this disclosure to provide a mask blank which includes a hard mask film having an excellent performance adapted to a high-bias etching condition and which is capable of achieving further miniaturization and pattern quality improvement of a pattern to be formed on a pattern-forming thin film.

It is another aspect of this disclosure to provide a method for manufacturing a transfer mask, by using the mask blank, which is capable of forming a fine pattern on a pattern-forming thin film with high accuracy.

It is a further aspect of this disclosure to provide a method for manufacturing a semiconductor device using the transfer mask.

Means to Solve the Problem

This disclosure has the following configurations as means for solving the above-mentioned problems.

(Configuration 1)

A mask blank having a structure in which a pattern-forming thin film and a hard mask film are formed as layers on a substrate in this order;

wherein the hard mask film is made of a material containing silicon and oxygen;

wherein an Si2p narrow spectrum, obtained by analyzing the hard mask film by X-ray photoelectron spectroscopy, has a maximum peak at a binding energy of at least 103 eV;

wherein an N1s narrow spectrum, obtained by analyzing the hard mask film by X-ray photoelectron spectroscopy, has a maximum peak below a detection lower limit value; and wherein, in the hard mask film, a content ratio (atomic %) of silicon and oxygen is Si:O=1:less than 2.

(Configuration 2)

The mask blank according to Configuration 1, wherein an O1s narrow spectrum, obtained by analyzing the hard mask film by X-ray photoelectron spectroscopy, has a maximum peak at a binding energy of at least 532 eV.

(Configuration 3)

The mask blank according to Configuration 1 or 2, wherein an O1s narrow spectrum, obtained by analyzing the hard mask film by X-ray photoelectron spectroscopy, has a maximum peak at a binding energy of less than 533 eV.

(Configuration 4)

The mask blank according to any one of Configurations 1 to 3, wherein a difference is at most 0.2 eV between a binding energy at which a maximum peak is present in an Si2p narrow spectrum obtained by analyzing a surface of the hard mask film by X-ray photoelectron spectroscopy and a binding energy at which a maximum peak is present in an Si2p narrow spectrum obtained by analyzing an inside of the hard mask film by X-ray photoelectron spectroscopy.

(Configuration 5)

The mask blank according to any one of Configurations 1 to 4, wherein a difference is at most 0.1 eV between a binding energy at which a maximum peak is present in an O1s narrow spectrum obtained by analyzing a surface of the hard mask film by X-ray photoelectron spectroscopy and a binding energy at which a maximum peak is present in an O1s narrow spectrum obtained by analyzing an inside of the hard mask film by X-ray photoelectron spectroscopy.

(Configuration 6)

The mask blank according to any one of Configurations 1 to 5, wherein the Si2p narrow spectrum, obtained by analyzing the hard mask film by X-ray photoelectron spectroscopy, has no peak at a binding energy in a range of at least 97 eV and at most 100 eV.

(Configuration 7)
The mask blank according to any one of Configurations 1 to 6, wherein the hard mask film has an oxygen content of at least 60 atomic %.

(Configuration 8)
The mask blank according to any one of Configurations 1 to 7, wherein the hard mask film is formed of a material containing silicon and oxygen or a material containing silicon, oxygen, and at least one element selected from non-metal elements except nitrogen and metalloid elements.

(Configuration 9)
The mask blank according to any one of Configurations 1 to 7, wherein the pattern-forming thin film is made of a material containing at least one element selected from chromium, tantalum, and nickel.

(Configuration 10)
The mask blank according to any one of Configurations 1 to 9, wherein the pattern-forming thin film is a light-shielding film.

(Configuration 11)
The mask blank according to Configuration 10, wherein a phase shift film is formed between the substrate and the light-shielding film.

(Configuration 12)
The mask blank according to any one of Configurations 1 to 9, wherein the pattern-forming thin film is an absorber film.

(Configuration 13)
A method for manufacturing a transfer mask by using the mask blank according to any one of Configurations 1 to 12, comprising the steps of:
forming a transfer pattern on the hard mask film by dry etching using a fluorine-based gas and using, as a mask, a resist film formed on the hard mask film and having the transfer pattern; and
forming the transfer pattern on the pattern-forming thin film by dry etching using a chlorine-containing gas and using, as a mask, the hard mask film with the transfer pattern formed thereon.

(Configuration 14)
The method according to Configuration 13, wherein the dry etching using the chlorine-containing gas is dry etching which is carried out by using an oxygen-containing chlorine-based gas with an increased ratio of a chlorine-based gas and under a condition where a high bias voltage is applied.

(Configuration 15)
The method according to Configuration 13, wherein the dry etching using the chlorine-containing gas is dry etching which is carried out by using an oxygen-free chlorine-based gas and under a condition where a high bias voltage is applied.

(Configuration 16)
A method for manufacturing a semiconductor device, comprising a step of using the transfer mask manufactured by the method according to any one of Configurations 13 to 15 and transferring by exposure the transfer pattern on a resist film on a substrate to be provided with a semiconductor device.

Effect of the Disclosure

According to this disclosure having the above-mentioned configurations, it is possible to provide a mask blank having a structure in which a pattern-forming thin film, such as a light-shielding film, and a hard mask film are formed as layers on a substrate in this order, the mask blank being capable of achieving further miniaturization and pattern quality improvement of a pattern to be formed on the pattern-forming thin film, such as a light-shielding film, and a pattern to be formed on the hard mask film.

In particular, according to this disclosure, it is possible to provide a mask blank which includes a hard mask film having an excellent performance adapted to a high-bias etching condition and which is capable of achieving further miniaturization and pattern quality improvement of a pattern to be formed on a pattern-forming thin film.

According to this disclosure, it is also possible to provide a method for manufacturing a transfer mask, which is capable of forming a fine pattern on a pattern-forming thin film with high accuracy by using the mask blank.

According to this disclosure, it is furthermore possible to provide a method for manufacturing a semiconductor device using the transfer mask.

MODE FOR EMBODYING THE DISCLOSURE

Figure 1:
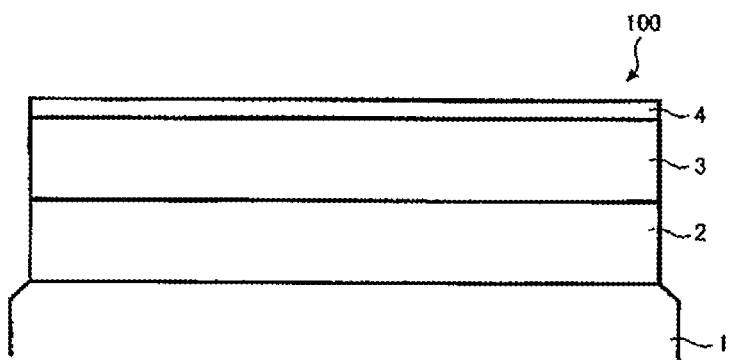
FIG. 1 is a schematic sectional view of a mask blank according to an embodiment of this disclosure.

Now, several embodiments of this disclosure will be described. At first, how this disclosure has been reached will be described.

The present inventors studied about further miniaturization and pattern quality improvement of a pattern to be formed on a hard mask film. As a result, the following matters have been found out.

First, it has been found out that, in a hard mask film made of a material containing silicon and oxygen, if a content ratio (atomic %) of silicon (Si) and oxygen (O) is Si:O=1:less than 2 (oxygen-deficient $SiO_2$ film) <Condition 1>, an etching rate for a fluorine-based gas is high and the hard mask film can be etched rapidly and excellently, as compared with a case of Si:O=1:2 ($SiO_2$ film which is not oxygen-deficient).

Second, it has been revealed that, in the hard mask film made of the material containing silicon and oxygen, if an existence ratio of Si—O bonds with a low oxidation degree is high or if an existence ratio of silicon-silicon bonds (Si—Si bonds) which are not bonded to oxygen is high, resistance against dry etching using an oxygen-containing chlorine-based gas is significantly decreased. The decrease in resistance against the dry etching makes those phenomena prominent which are caused in the middle of patterning a pattern-forming thin film (such as a light-shielding film) by the dry etching using the oxygen-containing chlorine-based gas and using, as a mask, the hard mask film provided with a fine pattern, that is, a phenomenon of deterioration in edge shape of the fine pattern of the hard mask film and a phenomenon of progress of side etching of a sidewall of the fine pattern. In this case, even if the fine pattern is formed on the hard mask film with high accuracy, there arises a phenomenon that a pattern shape of the hard mask film is deteriorated when the dry etching using the pattern of the hard mask film as a mask is performed on the pattern-forming thin film. Due to the phenomenon, there arises a problem that the fine pattern cannot be formed with high accuracy on the pattern-forming thin film.

The decrease in resistance against the dry etching of the hard mask film using the oxygen-containing chlorine-based gas is prominent in case of a high-bias etching condition. Generally, when a thin film is dry etched, both of etching by a chemical reaction and etching by a physical action are carried out. The etching by the chemical reaction is carried out in a process in which an etching gas in a plasma state is brought into contact with a surface of the thin film and is bonded to silicon or a metal element in the thin film to generate a low-boiling-point compound (for example, $SiF_4$, $CrO_2Cl_2$, or the like) to be sublimated. In the etching by the chemical reaction, for silicon or the metal element bonded to other element (for example, O, N, or the like), those bonds are broken to generate the low-boiling-point compound.

In contrast, the physical etching is carried out in a process in which ionic plasma in the etching gas is accelerated by a bias voltage and collides with the surface of the thin film (this phenomenon is also called "ion bombardment") to physically eject those elements, including silicon or the metal element, on the surface of the thin film (at that time, the bonds between the elements are broken) to generate a low-boiling-point compound with silicon or the metal element and sublimate the low-boiling-point compound.

In high-bias etching, the dry etching by the physical action is enhanced as compared with dry etching in a normal condition. The dry etching by the physical action significantly contributes to etching in a film thickness direction but does not much contribute to etching in a sidewall direction of a pattern. On the other hand, the etching by the chemical reaction contributes to both of the etching in the film thickness direction and the etching in the sidewall direction of the pattern (side etching).

In order to solve the above-mentioned problem of the decrease in resistance of the hard mask film against the dry etching using the oxygen-containing chlorine-based gas, the hard mask film must be formed of a material which has a low existence ratio of the Si—O bonds with a low oxidation degree or which has a low existence ratio of the Si—Si bonds. As a result of further study, the inventors reached an idea that an Si2p narrow spectrum obtained by analysis of X-ray photoelectron spectroscopy (XPS) should be used as an index of measuring an existence ratio of bonds in the material forming the hard mask film. Specifically, it has been found out that the hard mask film should be adjusted so that the Si2p narrow spectrum obtained by analyzing the hard mask film by X-ray photoelectron spectroscopy has a maximum peak at a binding energy of at least 103 eV <Condition 2>. It is said that the hard mask film, from which such Si2p narrow spectrum is obtained, has a low existence ratio of the Si—O bonds with a low oxidation degree or a low existence ratio of the silicon-silicon bonds (Si—Si bonds) which are not bonded to oxygen, even if the content ratio (atomic %) of silicon (Si) and oxygen (O) is Si:O=1:less than 2.

Silicon (Si) and oxygen (O) may take various binding forms. For example, there are a form in which one silicon (Si) atom is bonded to one oxygen atom, a form in which one silicon (Si) atom is bonded to two oxygen atoms, a form in which one silicon (Si) atom is bonded to three oxygen atoms, a form in which one silicon (Si) atom is bonded to four oxygen atoms, and so on. Furthermore, silicon (Si), oxygen (O), and hydrogen (H) may take various binding forms. For example, there are a form in which one silicon (Si) atom is bonded to three oxygen (O) atoms and one hydrogen (H) atom, a form in which one silicon (Si) atom is bonded to one oxygen (O) atom and one hydrogen (H) atom, a form in which one silicon (Si) atom is bonded to two oxygen (O) atoms and one hydrogen (H) atom, and so on. Therefore, it is difficult to identify the binding form of the respective constituent elements inside the film by identifying a composition of the hard mask film.

On the other hand, a position of a binding energy at which a maximum peak is present in an Si2p narrow spectrum obtained by analyzing a silicon nitride film by X-ray photoelectron spectroscopy is relatively near to a position of a binding energy at which a maximum peak is present in an Si2p narrow spectrum obtained by analyzing a silicon oxide film by X-ray photoelectron spectroscopy. Therefore, when the hard mask film made of the material containing silicon and oxygen further contains nitrogen, even if the hard mask film has a high existence ratio of the Si—O bonds with a low oxidation degree or a high existence ratio of the Si—Si bonds, the maximum peak of the Si2p narrow spectrum may possibly be present at a position of a binding energy of at least 103 eV due to presence of Si—N bonds. Then, it is not possible to use, as an index, the position of the binding energy at which the maximum peak is present in the Si2p narrow spectrum.

As a result of considering the above-mentioned problem, the inventors reached a conclusion that, if a maximum peak of an N1s narrow spectrum obtained by analyzing the hard mask film by X-ray photoelectron spectroscopy is below a detection lower limit value <Condition 3>, presence of nitrogen in the hard mask film does not affect the position of the binding energy at which the maximum peak is present in the Si2p narrow spectrum.

As a result of intense study mentioned above, the inventors reached a conclusion that, if the hard mask film containing silicon and oxygen satisfies all of the above-mentioned three conditions, i.e.;

<Condition 1> the content ratio (atomic %) of silicon (Si) and oxygen (O) is Si:O=1:less than 2;

<Condition 2> the Si2p narrow spectrum obtained by analysis of X-ray photoelectron spectroscopy has the maximum peak at a binding energy of at least 103 eV; and <Condition 3> the maximum peak of the N1s narrow spectrum is below the detection lower limit value, it is possible to achieve further miniaturization and pattern quality improvement of the pattern to be formed on the pattern-forming thin film and the pattern to be formed on the hard mask film.

The above-mentioned hard mask film requires a shorter etching time and, therefore, a resist can be reduced in thickness correspondingly. Corresponding to the reduction in thickness of the resist, collapse of a finer resist pattern can be prevented and formation of the finer resist pattern can be achieved. Furthermore, as described above, the hard mask film can be rapidly etched. Thus, it is possible to form a pattern of the hard mask film, which has an excellent (flat and smooth) sidewall with small sidewall roughness and small line edge roughness. As a result, it is possible to improve a pattern quality of the hard mask film.

When an etching rate of a certain film is increased, an etching time required to pattern the film is shortened. When the etching time required to pattern the film is shortened, a sidewall of the film is exposed to an etching gas for a shorter time duration, resulting in reduction of a side etching amount.

In addition, in case where the etching rate of the certain film is increased, the etching time in a film thickness direction is shortened so that the sidewall of the certain film is exposed to the etching gas for a shorter time duration. Thus, it is possible to form the pattern having an excellent (flat and smooth) sidewall with small sidewall roughness.

In order to obtain the above-mentioned effects and states, the content of oxygen in the hard mask film made of the material containing silicon and oxygen is preferably at most 66.5 atomic %, more preferably at most 66.0 atomic %, further preferably at most 65.5 atomic %. If the content of oxygen is too large, the above-mentioned effects and states are difficult to obtain.

In order to obtain the above-mentioned effects and states, the content of oxygen in the hard mask film made of the material containing silicon and oxygen is preferably at least 60 atomic %, more preferably at least 62 atomic %, further preferably at least 64 atomic %. If the content of oxygen is too small, the above-mentioned effects and states are difficult to obtain.

In order to obtain the above-mentioned effects and states, the content of silicon in the hard mask film made of the material containing silicon and oxygen is preferably at least 30 atomic %, more preferably at least 31 atomic %, further preferably at least 32 atomic %. If the content of silicon is too small, the above-mentioned effects and states are difficult to obtain.

In order to obtain the above-mentioned effects and states, the content of silicon in the hard mask film made of the material containing silicon and oxygen is preferably at most 40 atomic %, more preferably at most 39 atomic %, further preferably at most 38 atomic %. If the content of silicon is too large, the above-mentioned effects and states are difficult to obtain.

In case where, in the hard mask film made of the material containing silicon and oxygen, the content ratio (atomic %) of silicon (Si) and oxygen (O) is Si:O=1:less than 2 (oxygen-deficient $SiO_2$ film), it is assumed that a small number of atoms of an element, such as N and C, still present in a film-forming chamber even in a high-vacuum state enter into an oxygen-deficient portion.

It is noted that characteristics of a thin film (including characteristics such as an etching rate and a pattern quality (etching quality and accuracy, sidewall roughness, line edge roughness)) are not determined solely by a composition of the thin film. Also, a film density and a crystalline state of the thin film are factors affecting the characteristics of the thin film. Therefore, various conditions upon forming the thin film by sputtering are adjusted so that the thin film has predetermined characteristics. For example, by adjusting a wide range of conditions during formation of the thin film, such as a pressure in the film-forming chamber, an electric power applied to a sputtering target, a positional relationship, such as a distance, between the target and a substrate to be film-formed, and so on, the thin film is formed so as to have the predetermined characteristics. Those film-forming conditions are inherent to a film-forming apparatus and are appropriately adjusted so that the thin film has the predetermined characteristics.

In case where the thin film is formed by reactive sputtering, it is effective to adjust a ratio of a gas mixture of a noble gas and a reactive gas (oxygen gas), but without being limited thereto.

As a method for forming the oxygen-deficient $SiO_2$ film, for example, a method for forming the film by sputtering using an $SiO_2$ target may be used.

As a method for forming the $SiO_2$ film which is not oxygen-deficient, for example, a method for forming the film by sputtering using an Si target and an $O_2$ gas may be used.

In order to obtain the above-mentioned effects and states, it is at least preferable that the Si2p narrow spectrum obtained by analysis of X-ray photoelectron spectroscopy (XPS) has the maximum peak at a binding energy of at most 103.5 eV. This means that, in the hard mask film, not only the Si—O bonds in a high-oxidation state but also the Si—O bonds or the Si—Si bonds in a low-oxidation state are present.

In addition to the above-mentioned conditions, it is preferable that an O1s narrow spectrum obtained by analyzing the hard mask film by X-ray photoelectron spectroscopy has a maximum peak at a binding energy of at least 532 eV. This means that a large amount of a highly oxidized substance, such as the Si—O bonds in a high-oxidation state, is present in the hard mask film. In addition to the above-mentioned conditions, it is preferable that the O1s narrow spectrum obtained by analyzing the hard mask film by X-ray photoelectron spectroscopy has a maximum peak at a binding energy of less than 533 eV. This means that a lowly oxidized substance, such as the Si—O bonds in a low-oxidation state, is present in the hard mask film.

It is preferable that, in the hard mask film made of the material containing silicon and oxygen, the Si2p narrow spectrum obtained by analysis of X-ray photoelectron spectroscopy has no peak (below a detection lower limit value) at a binding energy of at least 97 eV and at most 100 eV. In case where the Si2p narrow spectrum of the hard mask film has a peak at a binding energy in a range of at least 97 eV and at most 100 eV, the Si—Si bonds are present in the hard mask film at a predetermined ratio or more. This is not preferable.

In case where the hard mask film made of the material containing silicon and oxygen positively contains the Si—Si bonds (for example, an integrated intensity of the Si—Si bonds ranges from at least half of an integrated intensity of the Si—O bonds to a level equivalent thereto; both of the Si—O bonds and the Si—Si bonds are present in significant proportions), in the hard mask film, the Si2p narrow spectrum obtained by analysis of X-ray photoelectron spectroscopy has the maximum peak at the binding energy of less than 103 eV and the maximum peak of the Si—Si bonds at the binding energy in a range of at least 97 eV and at most 100 eV.

In the hard mask film made of the material containing silicon and oxygen, a difference between a binding energy at which a maximum peak is detected in an Si2p narrow spectrum obtained by analyzing a surface of the hard mask film by X-ray photoelectron spectroscopy and a binding energy at which a maximum peak is detected in an Si2p narrow spectrum obtained by analyzing an inside of the hard mask film is preferably at most 0.2 eV.

Furthermore, in the hard mask film made of the material containing silicon and oxygen, a difference between a binding energy at which a maximum peak is detected in an O1s narrow spectrum obtained by analyzing the surface of the hard mask film by X-ray photoelectron spectroscopy and a binding energy at which a maximum peak is detected in an O1s narrow spectrum obtained by analyzing the inside of the hard mask film is preferably at most 0.1 eV.

In each of the Si2p narrow spectrum and the O1s narrow spectrum of the hard mask film, a difference between the binding energies thereof is preferably smaller (preferably, substantially same) in the film thickness direction (depth direction) in order to achieve high controllability during etching of the hard mask film.

Now, a detailed structure of this disclosure mentioned above will be described with reference to the drawings. Description will be made using same reference numerals assigned to similar components in the figures.

First Embodiment

[Mask Blank and Manufacture Thereof]
(Mask Blank)

FIG. 1 is a view illustrating a schematic structure of a mask blank according to a first embodiment. The mask blank 100 illustrated in FIG. 1 has a structure in which a phase shift film 2, a light-shielding film 3 (pattern-forming thin film), and a hard mask film 4 are formed as layers in this order on one main surface of a transparent substrate 1. The mask blank 100 may have a structure including a resist film formed on the hard mask film 4 as necessary. Hereinafter, details of main constituent parts of the mask blank 100 will be described.

[Transparent Substrate]

The transparent substrate 1 is made of a material excellent in transmissivity for exposure light used in an exposure process in lithography. As the material of the type, synthetic quartz glass, aluminosilicate glass, soda lime glass, low-thermal-expansion glass ($SiO_2$—$TiO_2$ glass or the like), and other various types of glass substrates may be used. In particular, a substrate using synthetic quartz glass has a high transmissivity for ArF excimer laser light (having a wavelength of about 193 nm) and, therefore, may suitably be used as the transparent substrate 1 of the mask blank 100.

The exposure process in lithography herein referred to is an exposure process in lithography which is carried out using a phase shift mask manufactured using the mask blank 100. Exposure light refers to exposure light used in the exposure process. As the exposure light, any of ArF excimer laser light (having a wavelength of 193 nm), KrF excimer laser light (having a wavelength of 248 nm), and i-ray light (having a wavelength of 365 nm) is applicable. In view of miniaturization of a phase shift pattern in the exposure process, the ArF excimer laser light is desirably used as the exposure light. Accordingly, description will hereinafter be made about an embodiment in case where the ArF excimer laser light is used as the exposure light.

[Phase Shift Film]

The phase shift film 2 has a predetermined transmittance for exposure light used in an exposure transfer process, and an optical characteristic such that a predetermined phase difference is provided between the exposure light transmitted through the phase shift film 2 and the exposure light transmitted through air for a distance equal to a thickness of the phase shift film 2.

It is assumed here that the phase shift film 2 is made of a material containing silicon (Si). Preferably, the phase shift film 2 is made of a material containing nitrogen (N) in addition to silicon. The phase shift film 2 mentioned above is formed by using a material which can be patterned by dry etching using a fluorine-based gas and which has a sufficient etching selectivity over a CrOCN film or the like forming the light-shielding film 3 to be described later.

The phase shift film 2 may further contain at least one element selected from metalloid elements, non-metal elements, and metal elements as far as patterning is possible by the dry etching using the fluorine-based gas.

Among others, the metalloid elements may be, in addition to silicon, any metalloid elements. The non-metal elements may be, in addition to nitrogen, any non-metal elements. For example, at least one element selected from oxygen (O), carbon (C), fluorine (F), and hydrogen (H) is preferably contained. The metal elements are exemplified by molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), tin (Sn), boron (B), and germanium (Ge).

The phase shift film 2 is formed of, for example, MoSiN. In order to satisfy a predetermined phase difference (for example, 140 [deg] to 190 [deg], preferably 150 [deg] to 180 [deg]) and a predetermined transmittance (for example, 1% to 30%) for the exposure light (for example, ArF excimer laser light), a refractive index n, an extinction coefficient k, and a film thickness of the phase shift film 2 are selected. A composition of a film material and a film-forming condition are adjusted so that the refractive index n and the extinction coefficient k mentioned above are obtained.

[Light-Shielding Film]

The light-shielding film 3 preferably contains at least one element selected from chromium and tantalum. A film structure of the light-shielding film 3 may be a single-layer structure or a layered structure of two or more layers. In case of the layered structure, it is possible to provide a reflection reduction effect of reducing a reflectance for exposure light or inspection light upon defect inspection. The light-shielding film of the single-layer structure or each layer of the light-shielding film of the layered structure of two or more layers may have a substantially same composition in a thickness direction of the film or the layer, or may have a composition gradient in the thickness direction of the film or the layer. The film containing at least one element selected from chromium and tantalum can be patterned by dry etching using a gas mixture of a chlorine-based gas and an oxygen gas (oxygen-containing chlorine-based gas) or a chlorine-based gas containing substantially no oxygen gas.

The light-shielding film 3 is preferably formed of a material containing chromium. The material forming the light-shielding film 3 and containing chromium is exemplified by not only chromium metal but also a material containing chromium (Cr) and at least one element selected from oxygen (O), nitrogen (N), carbon (C), boron (B), and fluorine (F). Generally, a chromium-based material is etched by the oxygen-containing chlorine-based gas. However, an etching rate of chromium metal for such etching gas is not so high. Considering an increase in etching rate for the oxygen-containing chlorine-based gas as the etching gas, the material forming the light-shielding film 3 is preferably the material containing chromium and at least one element selected from oxygen, nitrogen, carbon, boron, and fluorine. The material forming the light-shielding film 3 and containing chromium may contain at least one element selected from molybdenum (Mo), indium (In), and tin (Sn). By containing at least one element selected from molybdenum, indium, and tin in the material containing chromium, it is possible to further increase the etching rate for the oxygen-containing chlorine-based gas. In case where the light-shielding film 3 is formed of the material containing chromium, the content of silicon is preferably at most 5 atomic %, more preferably at most 3 atomic %, further preferably substantially zero. This is because the light-shielding film 3 containing silicon is reduced in etching rate for the oxygen-containing chlorine-based gas, which is not preferable in the dry etching of the light-shielding film 3.

In case where the light-shielding film 3 is made of a material containing tantalum, such material may be, not only tantalum metal but also a material containing tantalum and at least one element selected from nitrogen, oxygen, boron, and carbon. For example, Ta, TaN, TaO, TaON, TaBN, TaBO, TaBON, TaCN, TaCO, TaCON, TaBCN, TaBOCN, and so on may be used. In case where Ta or TaN is used as a light-shielding layer of the light-shielding film 3, it is desirable to constitute a layered structure in which an antireflection layer of TaO or the like is formed on the light-shielding layer because Ta or TaN has a high reflectance for the exposure light. In case where the light-shielding film 3 is formed of the material containing tantalum, the content of silicon in the tantalum-containing material is preferably at most 5 atomic %, more preferably at most 3 atomic %, further preferably substantially zero. In case where the light-shielding film 3 is formed of the above-mentioned material containing tantalum and the light-shielding film 3 is patterned by dry etching with the hard mask film 4 used as a mask, a chlorine-based gas containing no oxygen is used as the etching gas.

The light-shielding film 3 preferably has an amorphous structure or a microcrystalline structure in view of reduction of surface roughness and line edge roughness (LER) of a formed light-shielding pattern.

The light-shielding film 3 is preferably formed by sputtering. Any sputtering method, such as DC sputtering, RF sputtering, and ion beam sputtering, is applicable. A magnetron sputtering method, a dual magnetron method, or a conventional method may be used. By forming the light-shielding film 3 by sputtering, the light-shielding film 3 may be formed into a film of the amorphous structure or the microcrystalline structure. A film-forming apparatus may be of an in-line type or a single-wafer type.

A multilayer structure of the light-shielding film 3 and the phase shift film 2 is required to assure an optical density (OD) greater than 2.0 for the exposure light. The optical density is preferably at least 2.8, more preferably at least 3.0.

[Hard Mask Film]

The hard mask film 4 is formed of a material containing silicon and oxygen or a material containing silicon, oxygen, and at least one element selected from non-metal elements except nitrogen and metalloid elements. The hard mask film 4 in this case may contain any metalloid elements. Among the metalloid elements, at least one element selected from boron, germanium, antimony, and tellurium is preferably contained because it is expected to increase a conductivity of silicon used as a target upon forming the hard mask film 4 by sputtering. The non-metal elements are exemplified by carbon (C), fluorine (F), and hydrogen (H).

The hard mask film 4 is formed in contact with a surface of the light-shielding film 3. The hard mask film 4 is a film formed of a material having an etching selectivity for the etching gas used upon etching the light-shielding film 3. It is sufficient that the hard mask film 4 has a film thickness enough to serve as an etching mask until the end of the dry etching for forming a pattern on the light-shielding film 3, basically without limitation in terms of optical characteristics. Therefore, a thickness of the hard mask film 4 can be considerably small as compared with a thickness of the light-shielding film 3.

The thickness of the hard mark film 4 is required to be at most 20 nm, preferably at most 15 nm, more preferably at most 10 nm. This is because, if the thickness of the hard mask film 4 is too large, a resist film to serve as an etching mask in dry etching for forming the pattern on the hard mask film 4 is increased in thickness. The thickness of the hard mask film 4 is required to be at least 2 nm, preferably at least 3 nm. This is because, if the thickness of the hard mask film 4 is too small, the pattern of the hard mask film 4 may possibly disappear before the end of the dry etching for forming the light-shielding pattern on the light-shielding film 3, depending on the condition of the high-bias etching with the oxygen-containing chlorine-based gas.

As regards the resist film of an organic material used as the etching mask in the dry etching by a fluorine-based gas to form the pattern on the hard mask film 4, it is sufficient that the resist film has a film thickness enough to serve as the etching mask until the end of the dry etching of the hard mask film 4. Therefore, as compared with a structure without the hard mask film 4, the resist film can considerably be reduced in thickness by providing the hard mask film 4.

In case where the hard mask film 4 is formed of the material containing silicon and oxygen, adhesion with the resist film of the organic material tends to be low. Therefore, a surface of the hard mask film 4 is preferably subjected to HMDS (Hexamethyldisilazane) treatment (or an equivalent treatment, alone or in combination with the HMDS treatment) to improve the adhesion of the surface.

The hard mask film 4 preferably has an amorphous structure or a microcrystalline structure in view of reduction of surface roughness and line edge roughness (LER) of the formed light-shielding pattern.

The hard mask film 4 is preferably formed by sputtering. Any sputtering method, such as DC sputtering, RF sputtering, and ion beam sputtering, is applicable. Sputtering may be a magnetron sputtering method, a dual magnetron method, or a conventional method. By forming the hard mask film 4 by sputtering, the hard mask film 4 may be formed into a film of the amorphous structure or the microcrystalline structure. A film-forming apparatus may be of an in-line type or a single-wafer type.

A material of a target is only required to contain silicon as a main component. A target of elemental silicon, a target containing silicon and oxygen, an $SiO_2$ target, and so on may be used.

[Resist Film]

In the mask blank 100, the resist film of the organic material is preferably formed in contact with the surface of the hard mask film 4 to a film thickness of at most 100 nm. In case of a fine pattern corresponding to the DRAM of hp32 nm generation, the light-shielding pattern to be formed on the light-shielding film 3 may be provided with SRAF (Sub-Resolution Assist Feature) having a line width of 40 nm. Even in this case, however, it is possible to reduce the film thickness of the resist film by providing the hard mask film 4 as mentioned above. Thus, a cross-section aspect ratio of the resist pattern formed by the resist film can be lowered to 1:2.5. Therefore, it is possible to prevent the resist pattern from being collapsed or detached during development or rinsing of the resist film. More preferably, the resist film has a film thickness of at most 80 nm. The resist film is preferably a resist for electron beam writing and exposure. More preferably, the resist is of a chemically-amplified type.

[Manufacturing Steps of Mask Blank]

The mask blank 100 of the above-mentioned structure is manufactured through the following steps. At first, the transparent substrate 1 is prepared. In the transparent substrate 1, an end face and a main surface have been polished to predetermined surface roughness (for example, root mean square roughness Rq of at most 0.2 nm in an inside region of a 1 μm square). Thereafter, the transparent substrate has been subjected to predetermined cleaning and drying.

Next, on the transparent substrate 1, the phase shift film 2 is formed by sputtering. After the phase shift film 2 is formed, annealing is carried out at a predetermined heating temperature. Next, the above-mentioned light-shielding film 3 is formed on the phase shift film 2 by sputtering. Then, the above-mentioned hard mask film 4 is formed on the light-shielding film 3 by sputtering. In formation of each layer by sputtering, a sputtering target containing the materials forming each layer at a predetermined composition ratio and a sputtering gas are used. Furthermore, film formation using a gas mixture of a noble gas and a reactive gas as a sputtering gas may be performed as necessary. Thereafter, in case where the mask blank 100 has the resist film, the surface of the hard mask film 4 is subjected to HMDS (Hexamethyldisilazane) treatment as necessary. Then, by a coating method such as spin coating, the resist film is formed on the surface of the hard mask film 4 having been subjected to the HMDS treatment to complete the mask blank 100.

(Manufacturing Method of Phase Shift Mask)

Next referring to FIGS. 2A to 2G, a method for manufacturing a phase shift mask (transfer mask) in the first embodiment will be described taking, as an example, a method for manufacturing a halftone phase shift mask by using the mask blank 100 having the structure illustrated in FIG. 1.

At first, the resist film is formed by spin coating on the hard mask film 4 of the mask blank 100. Next, on the resist film, a first pattern (phase shift pattern) to be formed on the phase shift film 2 is formed by exposure writing using an electron beam. Thereafter, the resist film is subjected to predetermined treatments, such as PEB (Post Exposure Bake), development, and post baking, to form the first pattern (resist pattern 5a) on the resist film (see FIG. 2A).

Figures 2A, 2E:
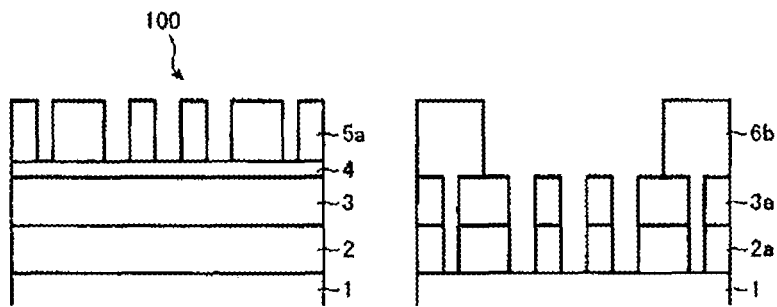
FIGS. 2A, 2B, 2C, 2D, 2E, 2F, and 2G are schematic sectional views for illustrating a manufacturing process of a phase shift mask according to this disclosure.
Figures 2B, 2F:
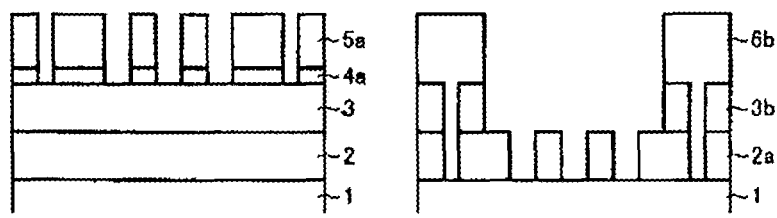

Next, using the resist pattern 5a as a mask, the hard mask film 4 is dry etched using a fluorine-based gas to form the first pattern (hard mask pattern 4a) on the hard mask film 4 (see FIG. 2B). Thereafter, the resist pattern 5a is removed. Herein, the light-shielding film 3 may be dry etched in a state where the resist pattern 5a is left without being removed. In this case, the resist pattern 5a disappears during the dry etching of the light-shielding film 3.

Figures 2C, 2G:
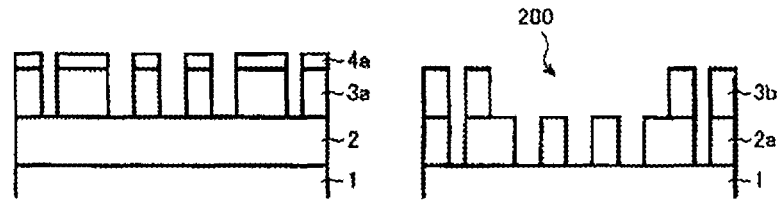

Next, using the hard mask pattern 4a as a mask, high-bias etching using the oxygen-containing chlorine-based gas is carried out to form the first pattern (light-shielding pattern 3a) on the light-shielding film 3 (see FIG. 2C). Dry etching of the light-shielding film 3 using the oxygen-containing chlorine-based gas is carried out using an etching gas with a higher mixing ratio of a chlorine-based gas than that in the past. The mixing ratio of the oxygen-containing chlorine-based gas in the dry etching of the light-shielding film 3 is preferably chlorine-based gas:oxygen gas=at least 10:1 in a gas flow rate ratio in an etching apparatus (in a chamber), more preferably at least 15:1, further preferably at least 20:1. By using the etching gas with the higher mixing ratio of the chlorine-based gas, it is possible to enhance anisotropy of dry etching. In the dry etching of the light-shielding film 3, the mixing ratio of the chlorine-based gas and the oxygen gas is preferably chlorine-based gas:oxygen gas=at most 40:1 in the gas flow rate ratio inside the etching chamber.

In the dry etching of the light-shielding film 3 using the oxygen-containing chlorine-based gas, a bias voltage applied on a rear surface of the transparent substrate 1 is increased to a level higher than that in the past. Although the effect obtained by increasing the bias voltage is different depending on an etching apparatus, for example, an electric power [W] upon application of the bias voltage is preferably at least 15 [W], more preferably at least 20 [W], further preferably at least 30 [W]. By increasing the bias voltage, it is possible to enhance anisotropy of the dry etching using the oxygen-containing chlorine-based gas.

Subsequently, using the light-shielding pattern 3a as a mask, dry etching using the fluorine-based gas is carried out to form the first pattern (phase shift pattern 2a) on the phase shift film 2 and to remove the hard mask pattern 4a (see FIG. 2D).

Next, a resist film is formed on the light-shielding pattern 3a by spin coating. On the resist film, a second pattern (light-shielding pattern) to be formed on the light-shielding film 3 is formed by exposure writing using an electron beam. Thereafter, predetermined treatments such as development are carried out to form a patterned resist film (resist pattern 6b) having the second pattern (light-shielding pattern) (see FIG. 2E).

Next, using the resist pattern 6b as a mask, dry etching using the oxygen-containing chlorine-based gas is carried out to form the second pattern (light-shielding pattern 3b) on the light-shielding film 3 (see FIG. 2F). Herein, the dry etching of the light-shielding film 3 may be carried out under conventional conditions with respect to the mixing ratio of the oxygen-containing chlorine-based gas and the bias voltage.

Furthermore, the resist pattern 6b is removed. Through predetermined treatments such as cleaning, the phase shift mask 200 is obtained (see FIG. 2G).

As the chlorine-based gas used in the dry etching in the above-mentioned manufacturing process, there is no particular limitation as far as Cl is contained. For example, the chlorine-based gas may be $Cl_2$, $SiCl_2$, $CHCl_3$, $CH_2Cl_2$, $CCl_4$, $BCl_3$, and so on. As the fluorine-based gas used in the dry etching in the above-mentioned manufacturing process, there is no particular limitation as far as F is contained. For example, the fluorine-based gas may be $CHF_3$, $CF_4$, $C_2F_6$, $C_4F_8$, $SF_6$, and so on. In particular, the fluorine-based gas free from C has a relatively low etching rate with respect to a glass substrate so that a damage on the glass substrate is further reduced.

The phase shift mask 200 manufactured by the above-mentioned process has a structure in which the phase shift pattern 2a and the light-shielding pattern 3b are formed as layers on the transparent substrate 1 in this order from closest to the transparent substrate 1.

In the method for manufacturing the phase shift mask described above, the phase shift mask 200 is manufactured by using the mask blank 100 described with reference to FIG. 1. In such manufacture of the phase shift mask, in the process of FIG. 2C as a dry etching process for forming the phase shift pattern (fine pattern to be formed on the phase shift film 2) on the light-shielding film 3, the dry etching using the oxygen-containing chlorine-based gas, which has a tendency toward isotropic etching, is applied. Furthermore, the dry etching using the oxygen-containing chlorine-based gas in the process of FIG. 2C is carried out under an etching condition where the ratio of the chlorine-based gas in the oxygen-containing chlorine-based gas is high and a high bias voltage is applied. Thus, in the dry etching process of the light-shielding film 3, it is possible to enhance the tendency toward anisotropy of etching while preventing a decrease in etching rate. As a consequence, side etching is reduced when the phase shift pattern is formed on the light-shielding film 3.

In addition, in this disclosure, by using the hard mask film 4 having an excellent performance suitable for the high-bias etching condition, it is possible to achieve further miniaturization and pattern quality improvement of the pattern to be formed on the hard mask film 4. As a result, it is possible to achieve further miniaturization and pattern quality improvement of the pattern to be formed on the light-shielding film 3.

Then, using, as an etching mask, the light-shielding pattern 3a having the phase shift pattern highly accurately formed by reducing the side etching of the light-shielding film 3 and achieving further miniaturization and pattern quality improvement of the pattern to be formed on the light-shielding film 3, the phase shift film 2 is dry etched using the fluorine-based gas. Thus, the phase shift pattern 2a can be formed with high accuracy. By the above-mentioned effect, it is possible to manufacture the phase shift mask 200 having excellent pattern accuracy.

(Method for Manufacturing Semiconductor Device)

Next, description will be made of a method for manufacturing a semiconductor device by using, as a transfer mask, the phase shift mask manufactured by the above-mentioned manufacturing method. The method for manufacturing a semiconductor device is characterized in that, by using the phase shift mask 200 of a halftone type manufactured by the above-mentioned manufacturing method, the transfer pattern (phase shift pattern 2a) of the phase shift mask 200 is transferred by exposure to a resist film on a substrate. The method for manufacturing a semiconductor device is carried out in the following manner.

At first, the substrate to be provided with the semiconductor device is prepared. The substrate may be, for example, a semiconductor substrate or a substrate having a semiconductor thin film. Furthermore, a microfabricated film may be formed thereon. Then, the resist film is formed on the prepared substrate and the resist film is subjected to pattern exposure by using the halftone phase shift mask 200 manufactured by the above-mentioned manufacturing method. Thus, the transfer pattern formed on the phase shift mask 200 is transferred by exposure on the resist film. At this time, exposure light corresponding to the phase shift film 2 forming the transfer pattern is used as exposure light. For example, ArF excimer laser light is used herein.

Furthermore, various steps are carried out, including formation of a resist pattern by developing the resist film having the transfer pattern transferred by exposure, etching of a surface layer of the substrate with the resist pattern used as a mask, introduction of impurities, and so on. After completion of these steps, the resist pattern is removed. The above-mentioned steps are repeatedly carried out on the substrate while exchanging the transfer mask. Furthermore, necessary processing steps are carried out to complete the semiconductor device.

In the manufacture of the semiconductor device mentioned above, by using, as the transfer mask, the halftone phase shift mask manufactured by the above-mentioned manufacturing method, it is possible to form, on the substrate, the resist pattern having accuracy sufficiently satisfying initial design specifications. Accordingly, in case where a circuit pattern is formed by dry etching of an underlayer film directly under the resist film with the pattern of the resist film used as a mask, it is possible to form the high-accuracy circuit pattern without short-circuiting or disconnection resulting from insufficient accuracy.

Second Embodiment

[Mask Blank and Manufacture Thereof]

A mask blank according to a second embodiment of this disclosure is a mask blank for use in manufacture of a binary mask (transfer mask) including a light-shielding film as a pattern-forming thin film. It is noted here that the mask blank according to the second embodiment of this disclosure may be used as a mask blank for manufacturing an eroded-type Levenson phase shift mask or a CPL (Chromeless Phase Lithography) mask.

The mask blank according to the second embodiment of this disclosure is an embodiment in which the phase shift film 2 in the mask blank according to the first embodiment described with reference to FIG. 1 is removed. It is noted here that the light-shielding film 3 according to the second embodiment is required to satisfy, by the light-shielding film 3 alone, the optical density (OD) which has been required to the layered structure of the phase shift film 2 and the light-shielding film 3 in the first embodiment.

A method for manufacturing the mask blank according to the second embodiment is an embodiment in which the manufacturing process and the working process (etching process) of the phase shift film 2 in the mask blank according to the first embodiment are removed.

In the mask blank according to the second embodiment of this disclosure, all of the transparent substrate 1, the light-shielding film 3, and the hard mask film 4 are similar in structure to all those described in connection with the mask blank according to the first embodiment.

Third Embodiment

[Mask Blank and Manufacture Thereof]

A mask blank according to a third embodiment of this disclosure is a mask blank for use in manufacturing a reflective mask (transfer mask) including a pattern-forming thin film being an absorber film (including a case where the film has a phase shift function).

Figure 6:
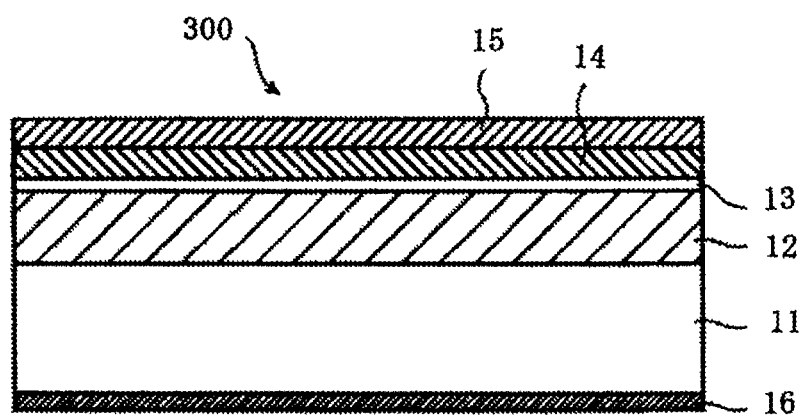
FIG. 6 is a schematic sectional view of a reflective mask blank according to an embodiment of this disclosure.

FIG. 6 is a schematic view for describing a structure of a reflective mask blank according to the third embodiment of this disclosure. As illustrated in FIG. 6, the reflective mask blank 300 has a substrate 11, a multilayer reflective film 12, a protective film 13, an absorber film 14 for absorbing EUV (Extreme Ultra Violet) light, and a hard mask film (hard mask for etching, i.e., etching mask) 15. These films are formed as layers in this order. The multilayer reflective film 12 is formed on a first main surface (front surface) of the substrate 11 and reflects the EUV light as exposure light. The protective film 13 is provided to protect the multilayer reflective film 12. The protective film 13 is formed of a material having a resistance against an etchant to be used upon patterning the absorber film 14, which will later be described, and against a cleaning liquid. The hard mask film 15 serves as a mask upon etching the absorber film 14. Generally, on a second main surface (rear surface) of the substrate 11, a rear conductive film 16 for electrostatic chucking is formed.

Now, each layer will be described.

[Substrate]

As the substrate 11, a material having a low thermal expansion coefficient in a range of 0±5 ppb/° C. is preferably used in order to prevent deformation of an absorber pattern due to heat during exposure by the EUV light. As the material having the low thermal expansion coefficient in the above-mentioned range, for example, $SiO_2$—$TiO_2$ glass, multicomponent glass ceramics, and the like may be used.

[Multilayer Reflective Film]

The multilayer reflective film 12 provides a function of reflecting the EUV light in a reflective mask 400 (FIG. 7E) which will later be described. The multilayer reflective film 12 has a structure as a multilayer film in which respective layers containing elements different in refractive index from one another are periodically formed as layers.

Generally, as the multilayer reflective film 12, a multilayer film is used in which a thin film (high refractive index layer) of a light element as a high refractive index material or a compound thereof and another thin film (low refractive index layer) of a heavy element as a low refractive index material or a compound thereof are alternately formed as layers in about 40 to 60 periods. The multilayer film may comprise a plurality of periods of layered structures of high/low refractive index layers where one period includes the high refractive index layer and the low refractive index layer formed as layers in this order from closest to the substrate 11. Alternatively, the multilayer film may comprise a plurality of periods of layered structures of low/high refractive index layers where one period includes the low refractive index layer and the high refractive index layer formed as layers in this order from closest to the substrate 11. An uppermost layer of the multilayer reflective film 12 (i.e., a surface layer of the multilayer reflective film 12 on the side opposite from the substrate 11) is preferably the high refractive index layer due to the following reason. In case where the above-mentioned multilayer film comprises a plurality of periods of layered structures (high/low refractive index layers) formed on the substrate 11 where one period includes the high refractive index layer and the low refractive index layer formed as layers in this order, the uppermost layer is the low refractive index layer. However, the low refractive index layer on an uppermost surface of the multilayer reflective film 12 is readily oxidized so that a reflectance of the multilayer reflective film 12 is reduced. In order to avoid reduction in reflectance, another high refractive index layer is further formed on the low refractive index layer as the uppermost layer. On the other hand, in case where the above-mentioned multilayer film comprises a plurality of periods of layered structures (low/high refractive index layers) formed on the substrate 11 where one period includes the low refractive index layer and the high refractive index layer formed as layers in this order, the uppermost layer is the high refractive index layer. In this case, it is unnecessary to further form another high refractive index layer.

In the third embodiment, a layer containing silicon (Si) is used as the high refractive index layer. As a material containing Si, not only elemental Si but also an Si compound containing boron (B), carbon (C), nitrogen (N), and/or oxygen (O) added to Si may be used. By using the layer containing Si as the high refractive index layer, it is possible to obtain the reflective mask 400 (FIG. 7E) for EUV lithography excellent in reflectance for the EUV light. In the third embodiment, a glass substrate is preferably used as the substrate 11. Si is excellent in adhesion with the glass substrate also. As the low refractive index layer, elemental metal selected from molybdenum (Mo), ruthenium (Ru), rhodium (Rh), and platinum (Pt) or an alloy thereof may be used. For example, as the multilayer reflective film 12 for the EUV light having a wavelength of 13 nm to 14 nm, an Mo/Si periodic layered film is preferably used which includes Mo films and Si films alternately formed as layers in about 40 to 60 periods. The high refractive index layer as the uppermost layer of the multilayer reflective film 12 may be formed of silicon (Si), and a silicon oxide layer containing silicon and oxygen may be formed between the uppermost layer (Si) and the Ru-based protective film 13. By forming the silicon oxide layer, it is possible to improve cleaning resistance of the reflective mask 400.

A method for forming the multilayer reflective film 12 is known in this technical field. For example, each layer of the multilayer reflective film 12 may be formed by ion beam sputtering. In case of the Mo/Si periodic multilayer film mentioned above, for example by ion beam sputtering, an Si film having a thickness of about 4 nm is at first formed on the substrate 11 by using an Si target and, thereafter, an Mo film having a thickness of about 3 nm is formed by using an Mo target. Defining the Si film and the Mo film as one period, 40 to 60 periods of films are formed as layers to form the multilayer reflective film 12. Preferably, the uppermost layer of the multilayer reflective film 12 is an Si layer.

[Protective Film]

The protective film 13 is formed on the multilayer reflective film 12 in order to protect the multilayer reflective film 12 from dry etching and cleaning in a manufacturing process of the reflective mask 400 which will later be described. In addition, during repair of black defects of a phase shift pattern by using an electron beam (EB), the multilayer reflective film 12 can be protected by the protective film 13. The protective film 13 may be a single layer or may have a layered structure including two or more layers. As a material of the protective film 13, a material containing ruthenium (Ru) as a main component may be used, for example, elemental metal Ru and an Ru alloy containing Ru and at least one metal selected from titanium (Ti), niobium (Nb), molybdenum (Mo), zirconium (Zr), yttrium (Y), boron (B), lanthanum (La), cobalt (Co), rhenium (Re), and so on.

The material of the protective film 13 may further contain nitrogen. Among those materials, an Ru-based protective film containing Ti is preferably used. In case where the Ru-based protective film containing Ti is used, silicon as an element constituting the multilayer reflective film is less diffused from the surface of the multilayer reflective film 12 to the Ru-based protective film. This provides characteristics that surface roughening during mask cleaning is decreased and peeling of the film hardly occurs. The decrease of the surface roughening directly leads to prevention of reduction in reflectance for the EUV exposure light. Accordingly, the decrease in surface roughening is important for the purpose of improvement of an exposure efficiency of EUV exposure and increase of throughput. The protective film 13 may have a structure in which each of lowermost and uppermost layers is made of a substance containing Ru and a metal other than Ru or an alloy thereof is interposed between the lowermost and the uppermost layers.

A thickness of the protective film 13 is not particularly limited as far as a function as the protective film 13 is fulfilled. In view of the reflectance for the EUV light, the thickness of the protective film 13 is preferably 1.0 nm to 8.0 nm, more preferably 1.5 nm to 6.0 nm.

As a method for forming the protective film 13, any known film-forming method may be used without any particular limitation. As a specific example of the method for forming the protective film 13, sputtering or ion beam sputtering may be cited.

[Absorber Film]

On the protective film 13, the absorber film 14 for absorbing the EUV light is formed. As a material of the absorber film 14, a material, which has a function of absorbing the EUV light and which can be processed by dry etching using an oxygen-containing chlorine-based gas or an oxygen-free chlorine-based gas, is used. As the material suitable for patterning the absorber film 14 by the dry etching using the oxygen-containing chlorine-based gas, for example, a material containing chromium (Cr) may be cited which is used as the material forming the light-shielding film 3 in the first embodiment. On the other hand, as the material suitable for patterning the absorber film 14 by the dry etching using the oxygen-free chlorine-based gas, for example, a material containing tantalum (Ta), a material containing nickel (Ni), and a material containing cobalt (Co) may be cited.

As the material forming the absorber film 14 and containing tantalum (Ta), not only tantalum metal but also a Ta-based material containing tantalum and at least one element selected from nitrogen, oxygen, boron, and carbon may be cited. For example, Ta, TaN, TaO, TaON, TaBN, TaBO, TaBON, TaCN, TaCO, TaCON, TaBCN, TaBOCN, and so on may be cited. In addition, as the material forming the absorber film 14, a TaTi-based material containing tantalum (Ta) and titanium (Ti) is applicable. As the TaTi-based material, TaTi alloy as well as a TaTi compound containing the TaTi alloy and at least one element selected from oxygen, nitrogen, carbon, and boron may be cited. For example, the TaTi compound may be TaTiN, TaTiO, TaTiON, TaTiCON, TaTiB, TaTiBN, TaTiBO, TaTiBON, TaTiBCON, and so on.

As the material forming the absorber film 14 and containing nickel (Ni), elemental nickel (Ni) or a nickel compound containing Ni as a main component is used. Ni is a material which has a large extinction coefficient for the EUV light as compared with Ta and which can be dry etched by a chlorine (Cl) gas. Ni has a refractive index n of about 0.948 and an extinction coefficient k of about 0.073 at a wavelength of 13.5 nm. In comparison, TaBN as an example of a material of a conventional absorber film has a refractive index n of about 0.949 and an extinction coefficient k of about 0.030.

The nickel compound may be a compound containing nickel and at least one element, selected from boron (B), carbon (C), nitrogen (N), oxygen (O), phosphorus (P), titanium (Ti), niobium (Nb), molybdenum (Mo), ruthenium (Ru), rhodium (Rh), tellurium (Te), palladium (Pd), tantalum (Ta), and tungsten (W), added thereto. By adding those elements to nickel, it is possible to improve processability by increasing an etching rate and/or to improve cleaning resistance. An Ni content ratio of the nickel compound is preferably at least 50 atomic % and less than 100 atomic %, more preferably at least 80 atomic % and less than 100 atomic %.

On the other hand, by forming the absorber film 14 of a structure containing cobalt (Co) and/or nickel (Ni), the extinction coefficient k could be at least 0.035 so that the absorber film can be reduced in thickness. By forming the absorber film 14 of an amorphous metal, it is possible to increase the etching rate, to achieve an excellent pattern shape, and to improve processing characteristics. The amorphous metal may include at least one element selected from cobalt (Co) and nickel (Ni) and at least one element (X), selected from tungsten (W), niobium (Nb), tantalum (Ta), titanium (Ti), zirconium (Zr), hafnium (Hf), yttrium (Y), and phosphorus (P), added thereto.

The above-mentioned absorber film 14 may be formed by a known method, for example, magnetron sputtering such as DC sputtering or RF sputtering.

The absorber film 14 may be an absorber film 14 adapted to the reflective mask blank 300 of a binary type and intended to absorb the EUV light. The absorber film 14 may also be an absorber film (phase shift film) adapted to the reflective mask blank 300 of a phase shift type and having a phase shift function in consideration of a phase difference of the EUV light.

In case of the absorber film 14 intended to absorb the EUV light, the film thickness is determined so that a reflectance of the absorber film 14 for the EUV light is at most 2%.

In case of the absorber film 14 having the phase shift function, a portion provided with the absorber film 14 absorbs and attenuates the EUV light, and reflects a part of the light at a level having no adverse influence upon pattern transfer. On the other hand, reflected light from a field portion without the absorber film 14 is reflected from the multilayer reflective film 12 through the protective film 13. By the absorber film 14 having the phase shift function, a desired phase difference can be established between the reflected light from the portion provided with the absorber film 14 and the reflected light from the field portion. The absorber film 14 is formed so that the phase difference between the reflected light from the absorber film 14 and the reflected light from the multilayer reflective film 12 (field portion) is 160 degrees (deg) to 200 degrees (deg). Those light beams inverted in phase and having a phase difference of about 180 degrees interfere with each other at a pattern edge portion, so that an image contrast of a projected optical image is improved. Following the improvement of the image contrast, a resolution is increased and various types of latitudes related to exposure are widened, such as exposure latitude and focus latitude. Although depending on patterns and exposure conditions, an estimate of the reflectance for obtaining a sufficient phase shift effect is generally at least 1% in absolute reflectance and at least 2% in reflection ratio with respect to the multilayer reflective film 12 (provided with the protective film 13).

The absorber film 14 may be a single-layer film. Also, the absorber film 14 may be a multilayer film comprising a plurality of films of at least two layers. In case where the absorber film 14 is a single-layer film, such film is characterized in that the number of steps during manufacture of a mask blank can be reduced and a production efficiency is increased. In case where the absorber film 14 is a multilayer film, an optical coefficient and a film thickness of an upper layer film are appropriately determined so that the upper layer film serves as an anti-reflection film during mask pattern inspection using light. This improves an inspection sensitivity during the mask pattern inspection using the light. Thus, by using the absorber film 14 being the multilayer film, it is possible to add various functions to the absorber film 14. In case where the absorber film 14 is the absorber film having the phase shift function, use of the absorber film 14 being the multilayer film widens a range of adjustment in an optical aspect to easily obtain a desired reflectance. It is possible to adopt another embodiment in which the hard mask film 15 of this disclosure, to be described later, is used as a part (uppermost layer) of the absorber film 14 being the multilayer film.

Preferably, an oxidized layer is formed on a surface of the absorber film 14 of the nickel compound. By forming the oxidized layer of the nickel compound, it is possible to improve cleaning resistance of an absorber pattern 14a of the reflective mask 400 (FIG. 7E) to be obtained. A thickness of the oxidized layer is preferably at least 1.0 nm, more preferably at least 1.5 nm. The thickness of the oxidized layer is preferably at most 5 nm, more preferably at most 3 nm. If the thickness of the oxidized layer is smaller than 1.0 nm, the effect is not expected because the thickness is too small. If the thickness exceeds 5 nm, a large influence is imposed on a surface reflectance for mask inspection light so that control to obtain a predetermined surface reflectance becomes difficult.

As a method for forming the oxidized layer, it is proposed to perform, on the mask blank after the absorber film is formed, warm water treatment, ozone water treatment, heat treatment in an oxygen-containing gas, ultraviolet irradiation treatment in an oxygen-containing gas, $O_2$ plasma treatment, and so on.

[Hard Mask Film]

The hard mask film 15 is formed on the absorber film 14. All contents including a material and a film thickness of the hard mask film 15 are similar to all the contents including the material and the film thickness of the hard mask film 4 described in the foregoing first embodiment.

Ni has a low dry etching rate for the chlorine-based gas as compared with Ta. Accordingly, if the resist film 17 (FIG. 7A) is formed directly on the absorber film 14 made of the material containing Ni, the resist film 17 must be thick and a fine pattern is difficult to form. On the other hand, by forming, on the absorber film 14, the hard mask film 15 made of a material containing Si, the absorber film 14 can be etched without increasing the thickness of the resist film 17. Thus, by using the hard mask film 15, a fine absorber pattern 14a can be formed.

In addition, the hard mask film 15 made of the material containing silicon and oxygen according to this disclosure is excellent in performance as compared with the prior art. In this disclosure, by using the hard mask film 15 having an excellent performance suitable for the high-bias etching condition, it is possible to achieve further miniaturization and pattern quality improvement of the pattern to be formed on the hard mask film 15. As a result, it is possible to achieve further miniaturization and pattern quality improvement of the pattern to be formed on the absorber film 14.

A film thickness of the hard mask film 15 is desirably at least 2 nm in view of obtaining a function as an etching mask for forming the transfer pattern on the absorber film 14 with high accuracy. The film thickness of the hard mask film 15 is desirably at most 20 nm, more desirably at most 15 nm in view of reducing the film thickness of the resist film 17.

[Rear Conductive Film]

Generally, on the second main surface (rear surface) of the substrate 11 (on the side opposite from the surface provided with the multilayer reflective film 12), the rear conductive film 16 for electrostatic chuck is formed. Typically, the rear conductive film 16 for electrostatic chuck is required to have an electric characteristic of at most 100 Ω/square. The rear conductive film 16 may be formed by, for example, magnetron sputtering or ion beam sputtering using a target of metal, such as chromium and tantalum, or an alloy thereof. Typical materials of the rear conductive film 16 are CrN and Cr which are often used in manufacture of a mask blank such as a light transmission mask blank. A thickness of the rear conductive film 16 is not particularly limited as far as a function of electrostatic chucking is satisfied but is, generally, 10 nm to 200 nm. The rear conductive film 16 also has a function of stress adjustment on the second main surface of the mask blank 300. The rear conductive film 16 is adjusted so as to establish a balance with stresses from the various kinds of films formed on the first main surface to thereby obtain the flat reflective mask blank 300.

(Reflective Mask and Method for Manufacturing the Same)

Using the reflective mask blank 300 in the third embodiment, the reflective mask 400 may be manufactured.

Figure 7A:
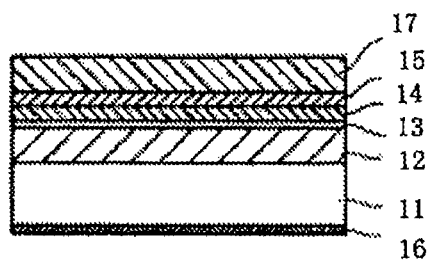
FIGS. 7A, 7B, 7C, 7D, and 7E are schematic sectional views for illustrating a manufacturing process of a reflective mask according to this disclosure.

Referring to FIGS. 7A to 7E, at first, the reflective mask blank 300 is prepared and the resist film 17 is formed on the hard mask film 15 on the first main surface of the mask blank (this step is unnecessary if the reflective mask blank 300 has the resist film 17) (FIG. 7A).

Figure 7B:
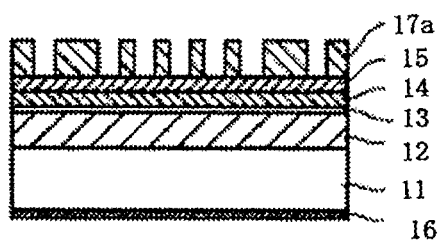

Next, a desired pattern is written (exposed) on the resist film 17 and, through development and rinsing, a predetermined resist pattern 17a is formed (FIG. 7B).

Figure 7C:
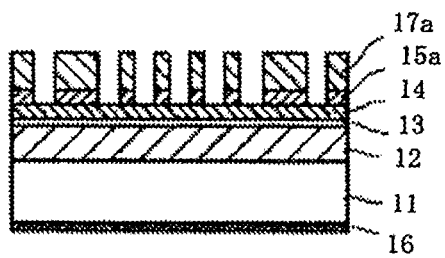

The hard mask film 15 is etched with the above-mentioned resist pattern 17a used as a mask to form an etching mask pattern 15a (FIG. 7C).

Figure 7D:
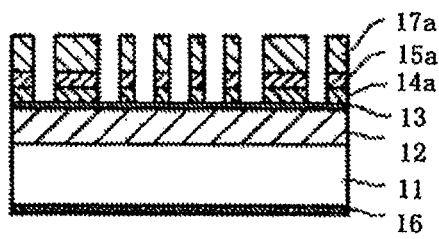

Next, the resist pattern 17a is removed by ashing, a resist remover liquid, or the like. Thereafter, with the etching mask pattern 15a used as a mask, dry etching is carried out to etch the absorber film 14 and to form the absorber pattern 14a (FIG. 7D).

Figure 7E:
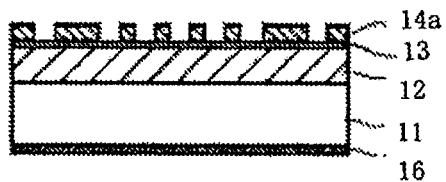

Thereafter, the etching mask pattern 15a is removed by dry etching (FIG. 7E). Finally, at least one of cleaning using an acidic aqueous solution and cleaning using an alkaline aqueous solution is carried out.

In case where the hard mask film 15 is formed of a material containing silicon (Si), an etching gas for formation of the pattern on the hard mask film 15 and removal of the etching mask pattern 15a may be a fluorine-based gas such as $CF_4$, $CHF_3$, $C_2F_6$, $C_3F_6$, $C_4F_6$, $C_4F_8$, $CH_2F_2$, $CH_3F$, $C_3F_6$, $SF_6$, and $F_2$ as well as a gas mixture containing the fluorine-based gas and a gas such as He, $H_2$, $N_2$, Ar, $C_2H_4$, and $O_2$ (they are collectively called a "fluorine-containing gas").

An etching gas for the absorber film 14 includes a chlorine-based gas such as $Cl_2$, $SiCl_4$, $CHCl_3$, and $CCl_4$, a gas mixture containing the chlorine-based gas and He at a predetermined ratio, and a gas mixture containing the chlorine-based gas and Ar at a predetermined ratio. In etching of the absorber film 14, no surface roughening is caused to occur on the Ru-based protective film because the etching gas contains substantially no oxygen. In the present specification, "etching gas contains substantially no oxygen" means that the content of oxygen in the etching gas is at most 5 atomic %.

There is also a method in which, without removing the resist pattern 17a immediately after formation of the etching mask pattern 15a, the absorber film 14 is etched using, as a mask, the etching mask pattern 15a with the resist pattern 17a. In this case, there is provided a characteristic that the resist pattern 17a is automatically removed during etching of the absorber film 14 so that the process is simplified. On the other hand, in the method of etching the absorber film 14 using, as a mask, the etching mask pattern 15a after removing the resist pattern 17a, there is provided a characteristic that stable etching can be performed without change of an organic product (outgas) from the resist which disappears during etching.

By the above-mentioned process, it is possible to obtain the reflective mask 400 having a high-accuracy fine pattern with a less shadowing effect and less sidewall roughness.

(Method for Manufacturing Semiconductor Device)

By performing EUV exposure using the reflective mask 400 in the third embodiment, a desired transfer pattern based on the absorber pattern 14a on the reflective mask 400 can be formed on a substrate to be provided with a semiconductor device.

EXAMPLES

Now, the embodiment of this disclosure will be described more in detail with reference to examples.

Example 1

[Manufacture of Mask Blank]

Referring to FIG. 1, the transparent substrate 1 made of synthetic quartz glass with the main surface having a size of about 152 mm×about 152 mm and a thickness of about 6.35 mm was prepared. In the transparent substrate 1, the end face and the main surface were polished to a predetermined surface roughness (at most 0.2 nm in Rq). Thereafter, the transparent substrate was subjected to predetermined cleaning and drying.

Next, the transparent substrate 1 was placed in a single-wafer DC sputtering apparatus and, using a mixed sintered target of molybdenum (Mo) and silicon (Si) (Mo:Si=11 atomic %:89 atomic %) and using a gas mixture of argon (Ar), nitrogen ($N_2$), and helium (He) as a sputtering gas, reactive sputtering (DC sputtering) was carried out to form, on the transparent substrate 1, the phase shift film 2 made of molybdenum, silicon, and nitrogen to a thickness of 69 nm.

Next, the transparent substrate 1 provided with the phase shift film 2 was subjected to heat treatment in order to reduce film stress of the phase shift film 2 and to form an oxidized layer on a surface layer. Specifically, using a heating furnace (electric furnace), heat treatment was carried out in air at a heating temperature of 450° C. for a heating time of 1 hour. By using a phase shift measurement apparatus (MPM 193 manufactured by Lasertec Corporation), a transmittance and a phase difference (phase shift amount) of the phase shift film 2 after the heat treatment with respect to light having a wavelength of 193 nm were measured. As a result, the transmittance was 6.0% and the phase difference was 177.0 degrees (deg).

Next, the transparent substrate 1 provided with the phase shift film 2 was placed in the single-wafer DC sputtering apparatus. Using a chromium (Cr) target, reactive sputtering (DC sputtering) was carried out in a gas mixture atmosphere of argon (Ar), carbon dioxide ($CO_2$), nitrogen ($N_2$), and helium (He). Thus, the light-shielding film (CrOCN film) 3 made of chromium, oxygen, carbon, and nitrogen was formed in contact with the phase shift film 2 to a thickness of 43 nm.

Next, the transparent substrate 1 provided with the above-mentioned light-shielding film (CrOCN film) 3 was subjected to heat treatment. Specifically, using a hot plate, the heat treatment was carried out in air at a heating temperature of 280° C. for a heating time of 5 minutes. After the heat treatment, for the transparent substrate 1 provided with the phase shift film 2 and the light-shielding film 3 formed as layers, an optical density of the layered structure of the phase shift film 2 and the light-shielding film 3 at a wavelength (about 193 nm) of ArF excimer laser light was measured by using a spectrophotometer (Cary 4000 manufactured by Agilent Technologies). As a result, it has been confirmed that the optical density was at least 3.0.

Next, the transparent substrate 1 with the phase shift film 2 and the light-shielding film 3 formed as layers was placed in the single-wafer DC sputtering apparatus. Using a silicon dioxide ($SiO_2$) target and an argon (Ar) gas (pressure: 0.03 Pa) as a sputtering gas and supplied with an electric power of 1.5 kW from an RF power supply, RF sputtering was carried out to form, on the light-shielding film 3, the hard mask film 4 made of silicon and oxygen to a thickness of 15 nm. Furthermore, predetermined cleaning was carried out to form the mask blank 100 in Example 1.

It has been found out that, as will later be described, the hard mask film 4 of silicon and oxygen has a high etching rate for the fluorine-based gas so that the hard mask film 4 can be rapidly and excellently etched.

It has been found out that the hard mask film 4 of silicon and oxygen has a tendency that a film density becomes relatively low (low density) and that a content ratio (atomic %) of silicon (Si) and oxygen (O) is Si:O=1:less than 2 (oxygen-deficient $SiO_2$ film).

By forming a phase shift film 2, a light-shielding film 3, and a hard mask film 4 on a main surface of another transparent substrate 1 under the same conditions, another mask blank 100 was prepared. The mask blank 100 was analyzed by X-ray photoelectron spectroscopy (XPS, with RBS correction). As a result, it has been found out that the contents of respective constituent elements of the hard mask film 4 were Si:35 atomic % and O:65 atomic % in average.

Figure 3:
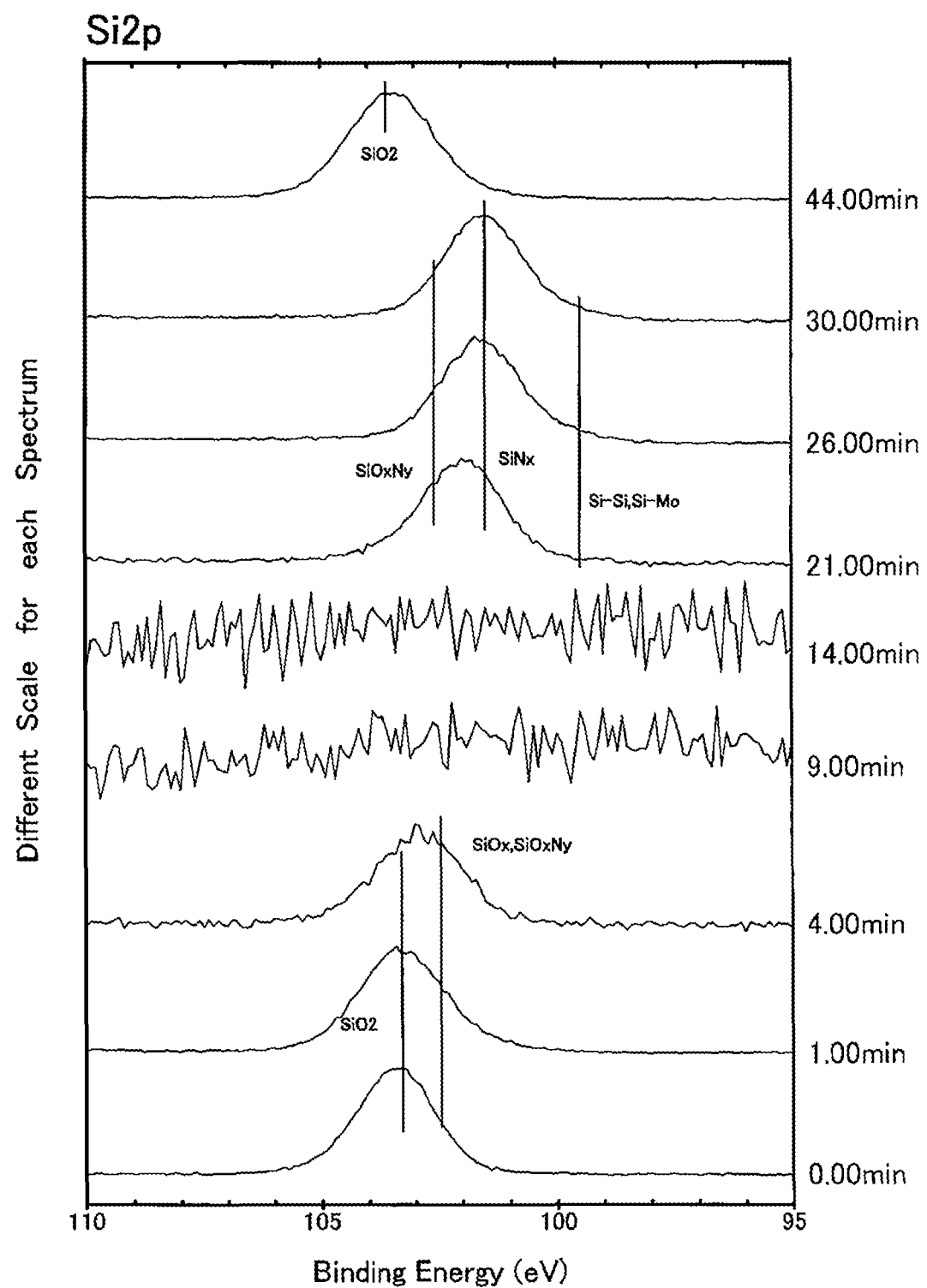
FIG. 3 is a view showing a result (Si2p narrow spectrum) of performing XPS analysis (analysis of a chemical bonding state in a depth direction) on a mask blank according to Example 1.
Figure 4:
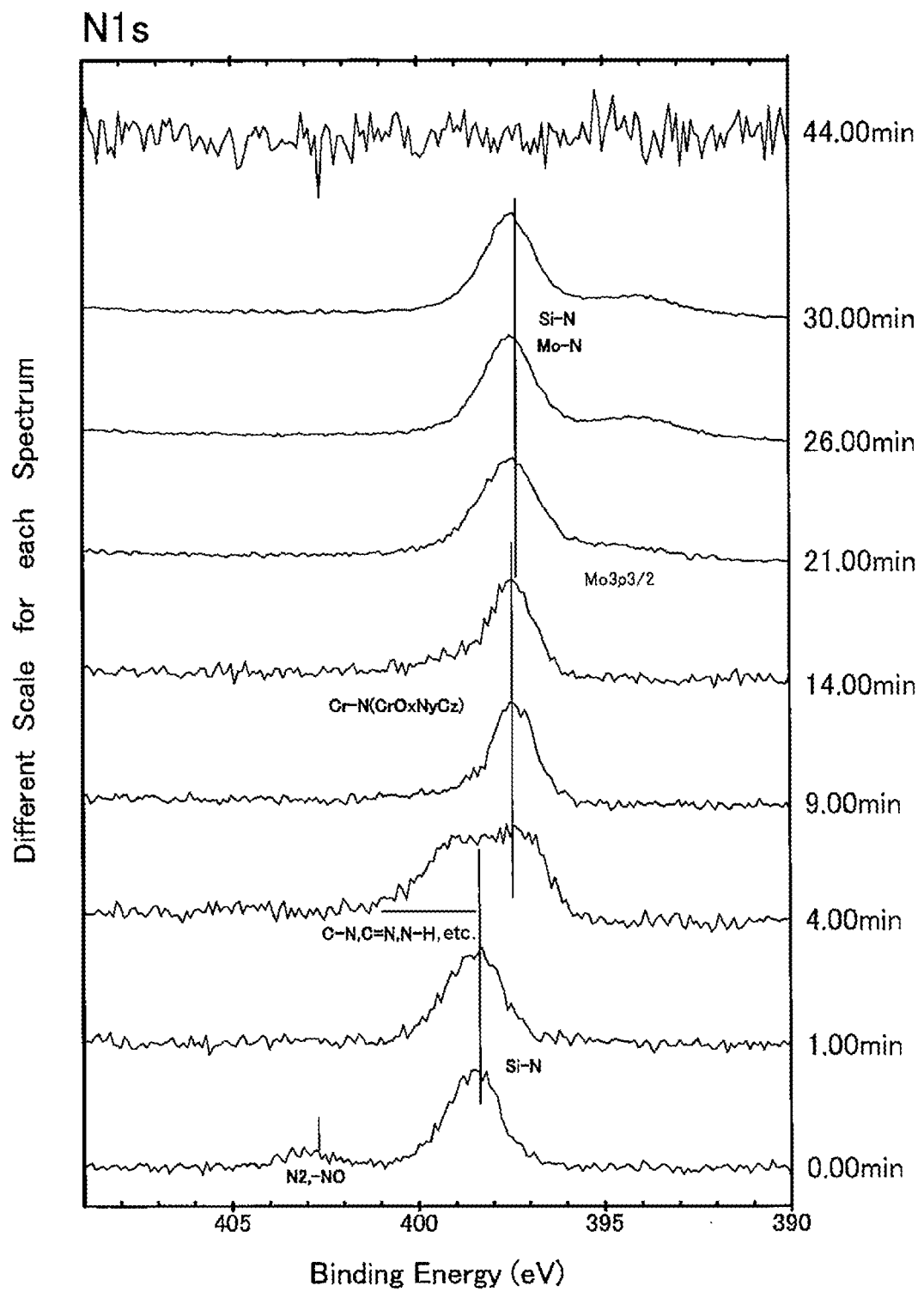
FIG. 4 is a view showing a result (N1s narrow spectrum) of performing XPS analysis (analysis of a chemical bonding state in a depth direction) on the mask blank according to Example 1.
Figure 5:
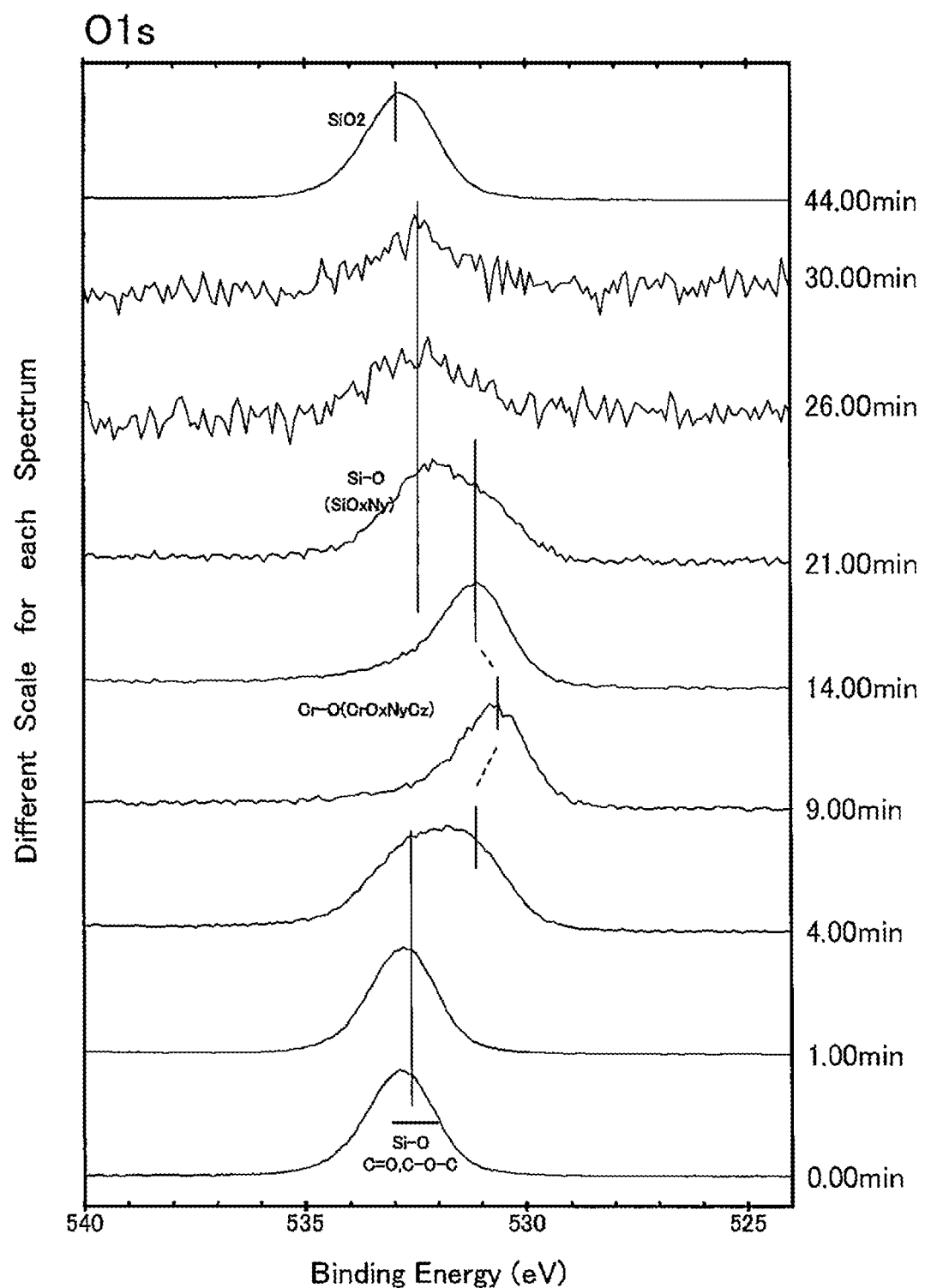
FIG. 5 is a view showing a result (O1s narrow spectrum) of performing XPS analysis (analysis of a chemical bonding state in a depth direction) on the mask blank according to Example 1.

FIG. 3, FIG. 4, and FIG. 5 show a result of analysis of a depth-direction chemical bond state of an Si2p narrow spectrum, a result of a depth-direction chemical bond state of an N1s narrow spectrum, and a result of a depth-direction chemical bond state of an O1s narrow spectrum, respectively, which were obtained as analysis results of X-ray photoelectron spectroscopy for the transparent substrate 1, the phase shift film 2, the light-shielding film 3, and the hard mask film 4 in Example 1.

In the analysis of X-ray photoelectron spectroscopy for the hard mask film 4, an X-ray is emitted toward the surface of the mask blank 100 (hard mask film 4) and energy distribution of photoelectrons ejected from the hard mask film 4 is measured. The hard mask film 4 is eroded by Ar gas sputtering for a predetermined time period. The surface of the hard mask film 4 in an eroded region is irradiated with the X-ray and energy distribution of photoelectrons ejected from the hard mask film 4 is measured. By repeating the above-mentioned steps, analysis in the film thickness direction is carried out in the order of the hard mask film 4, the light-shielding film 3, the phase shift film 2, and the transparent substrate 1. The analysis of the X-ray photoelectron spectroscopy was carried out using monochromatic Al (1486.6 eV) as an X-ray source and under a condition where a photoelectron detection area was 100 µmφ, and a detection depth was about 4 to 5 nm (takeoff angle of 45 deg) (the same applies to other examples and comparative examples which will hereinafter be described).

In each depth-direction chemical bond state analysis in FIGS. 3 to 5, an analysis result of the uppermost surface of the hard mask film 4 before Ar gas sputtering (sputtering time: 0 min) is shown in a "plot at 0.00 min." An analysis result of the hard mask film 4 at a position in the thickness direction after erosion from the uppermost surface of the hard mask film 4 for 1.00 min by Ar gas sputtering is shown in a "plot at 1.00 min."

In each depth-direction chemical bond state analysis in FIGS. 3 to 5, an analysis result of the light-shielding film 3 at a position in the thickness direction after erosion from the uppermost surface of the hard mask film 4 for 4.00 min by Ar gas sputtering is shown in a "plot at 4.00 min." An analysis result of the light-shielding film 3 at a position in the thickness direction after erosion from the uppermost surface of the hard mask film 4 for 9.00 min by Ar gas sputtering is shown in a "plot at 9.00 min." An analysis result of the light-shielding film 3 at a position in the thickness direction after erosion from the uppermost surface of the hard mask film 4 for 14.00 min by Ar gas sputtering is shown in a "plot at 14.00 min."

In each depth-direction chemical bond state analysis in FIGS. 3 to 5, an analysis result of the phase shift film 2 at a position in the thickness direction after erosion from the uppermost surface of the hard mask film 4 for 19.00 min by Ar gas sputtering is shown in a "plot at 19.00 min." An analysis result of the phase shift film 2 at a position in the thickness direction after erosion from the uppermost surface of the hard mask film 4 for 30.00 min by Ar gas sputtering is shown in a "plot at 30.00 min." An analysis result of the transparent substrate 1 at a position in the thickness direction after erosion from the uppermost surface of the hard mask film 4 for 44.00 min by Ar gas sputtering is shown in a "plot at 44.00 min."

In the narrow spectra in FIGS. 3 to 5, scales on a vertical axis are not same. Among the Si2p narrow spectra in FIG. 3, in each of the narrow spectra of the "plot at 9.00 min" and the "plot at 14.00 min", the scales on the vertical axis are enlarged as compared with the Si2p narrow spectra of the other plots. Thus, a wave of vibration in each of the narrow spectra of the "plot at 9.00 min" and the "plot at 14.00 min" in FIG. 3 does not represent presence of peaks but merely represents noise. This result shows that the content of silicon is below a detection lower limit value at a position in the thickness direction that corresponds to each Si2p narrow spectrum of the light-shielding film 3.

Among the narrow spectra in FIG. 4, in each of the narrow spectra of the "plot at 0.00 min", the "plot at 1.00 min", and the "plot at 44.00 min", scales on the vertical axis are enlarged as compared with the N1s narrow spectra of the other plots. Thus, a wave of vibration in each of the N1s narrow spectra of the "plot at 0.00 min", the "plot at 1.00 min", and the "plot at 44.00 min" in FIG. 4 does not represent presence of peaks but merely represents noise (that is, below a detection lower limit value). This result shows that the content of nitrogen is below a detection lower limit value at a position in the thickness direction that corresponds to each of the N1s narrow spectra of the hard mask film 4 and the transparent substrate 1.

In the Si2p narrow spectrum of the "plot at 4.00 min" in FIG. 3, scales on the vertical axis are enlarged as compared with the narrow spectra of the "plot at 0.00 min" and the "plot at 1.00 min". Thus, it is shown that a small peak is detected in the Si2p narrow spectrum of the "plot at 4.00 min". This result shows that, at the position of the light-shielding film 3 in the thickness direction that corresponds to the "plot at 4.00 min", the peak is detected under a little influence of the hard mask film 5 which has been present thereon.

The analysis result of the hard mask film 4 at the position in the thickness direction after erosion from the uppermost surface of the hard mask film 4 for 1.00 min by Ar gas sputtering is a measurement result for a portion of the hard mask film 4 except a surface layer portion.

From the result of the Si2p narrow spectra in FIG. 3, it is understood that the hard mask film 4 in Example 1 has a maximum peak at a binding energy (103.4 eV) between 103 and 103.5 eV. This result means that Si—O bonds are present at a predetermined ratio or more (Si—O bonds with a high oxidation degree is predominant) and that an existence ratio of Si—O bonds or Si—Si bonds with a low oxidation degree is low.

From the result of the Si2p narrow spectra (narrow spectra of the "plot at 0.00 min" and the "plot at 1.00 min") of the hard mask film 4 in FIG. 3, it is understood that the hard mask film 4 in Example 1 has a substantially flat waveform at the binding energy between 97 eV and 100 eV and has no peak (below a detection lower limit value). This result means that presence of Si—Si bonds was not detected from the hard mask film 4.

From the result of the Si2p narrow spectra in FIG. 3, it is understood that, in the hard mask film 4 in Example 1, a difference between a maximum peak position of the uppermost surface (0.00 min) and a maximum peak position of the inside of the film (1.00 min) is slightly less than 0.2 eV. It has been found out that the difference being relatively small is preferable in order to achieve high controllability during etching of the hard mask film.

From the result of the N1s narrow spectra in FIG. 4, it has been found out that the hard mask film in Example 1 has a maximum peak below the detection lower limit value. This result means that atoms bonded to nitrogen, including Si—N bonds, were not detected from the hard mask film 4 in Example 1.

As described above, it has been found out that the hard mask film 4 in Example 1 was formed of a material simultaneously satisfying the following three conditions. That is, the content ratio of silicon (Si) and oxygen (O) is Si:O=1:less than 2 (1:1.86) so that the condition 1 is satisfied. The Si2p narrow spectrum has the maximum peak at a binding energy (103.4 eV) between 103 and 103.5 eV so that the condition 2 is satisfied. Furthermore, the N1s narrow spectrum has the maximum peak below the detection lower limit value so that the condition 3 is satisfied.

From the result of the O1s narrow spectra in FIG. 5, it is understood that the hard mask film 4 in Example 1 has a maximum peak at the binding energy between 532 and 533 eV. This means that a highly oxidized substance (Si—O bonds with a high oxidation degree) is present at a predetermined ratio or more ($SiO_2$ is predominant).

From the result of the O1s narrow spectra in FIG. 5, it is understood that, in the hard mask film 4 in Example 1, there is no substantial difference (less than 0.05 eV) between the maximum peak position of the upper most surface (0.00 min) and the maximum peak position of the inside of the film (1.00 min). It has been found out that the difference being relatively small is preferable in order to achieve high controllability during etching of the hard mask film.

[Manufacture of Phase Shift Mask]

Next, using the mask blank 100 in Example 1, the phase shift mask 200 of the halftone type in Example 1 was manufactured through the following steps. Referring to FIGS. 2A to 2G, at first, the surface of the hard mask film 4 was subjected to HMDS treatment.

Subsequently, by spin coating, the resist film of a chemically amplified resist for electron beam writing was formed to a film thickness of 70 nm (80 nm in prior art) in contact with the surface of the hard mask film 4. Next, the first pattern as the phase shift pattern to be formed on the phase shift film 2 was formed on the resist film by electron beam writing and predetermined development and cleaning were carried out to form the resist pattern 5a having the first pattern (see FIG. 2A). The first pattern is a pattern (phase shift pattern) including a fine pattern (such as a SRAF pattern having a line width of at most 35 nm (at most 40 nm in prior art)) to be formed on the phase shift film 2. The resist pattern 5a formed on the hard mask film 4 was excellent without collapse of the resist pattern.

Next, with the resist pattern 5a used as a mask, the dry etching using a $CF_4$ gas was carried out to form the first pattern (hard mask pattern 4a) on the hard mask film 4 (see FIG. 2B).

At this time, it has been found out that the hard mask film 4 of silicon and oxygen has a high etching rate for the fluorine-based gas and the hard mask film can be rapidly etched with high accuracy.

The etching rate of the hard mask film 4 was calculated from the film thickness and the etching time of the hard mask film 4. As a result, the etching rate for the fluorine-based gas was relatively high as compared with the hard mask film 4 in Comparative Example 1 which will later be described.

The hard mask pattern 4a was observed by a scanning electron microscope (SEM). As a result, a surface of a sidewall was smooth.

Next, the resist pattern 5a was removed. Subsequently, with the hard mask pattern 4a used as a mask, the dry etching (high-bias etching with an electric power of 50 [W] when the bias voltage was applied) was carried out by using the gas mixture of the chlorine-based gas ($Cl_2$) and the oxygen gas ($O_2$) (gas flow rate ratio $Cl_2:O_2=13:1$) to form the first pattern (light-shielding pattern 3a) on the light-shielding film 3 (see FIG. 2C). An etching time (total etching time) of the light-shielding film 3 was 1.5 times a time period (just etching time) from the start of etching of the light-shielding film 3 until the surface of the phase shift film 2 was first exposed. Thus, over-etching was carried out for an additional time (over-etching time) of 50% of the just etching time. By carrying out the above-mentioned over-etching, it is possible to improve verticality of a pattern sidewall of the light-shielding film 3.

The hard mask pattern 4a after the end of the over-etching was observed by the scanning electron microscope (SEM). As a result, an edge between the sidewall of the pattern and the surface of the pattern (the surface opposite from a bottom surface of the pattern (the upper surface of the pattern)) was sharp (corner was not rounded). A surface of the sidewall of the hard mask pattern 4a was smooth.

Figure 2D:
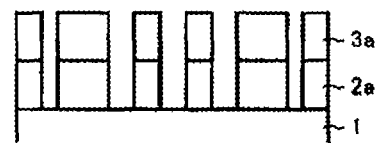

Next, with the light-shielding pattern 3a used as a mask, the dry etching using the fluorine-based gas ($SF_6$+He) was carried out to form the first pattern (phase shift pattern 2a) on the phase shift film 2 and to remove the hard mask pattern 4a simultaneously (see FIG. 2D).

Next, on the light-shielding pattern 3a, the resist film of the chemically amplified resist for electron beam writing was formed by spin coating to a film thickness of 150 nm. Next, the second pattern as the pattern to be formed on the light-shielding film (pattern including a light-shielding zone pattern) was written by exposure on the resist film, followed by the predetermined treatment such as development, to form the resist pattern 6b having the light-shielding pattern (see FIG. 2E).

Subsequently, with the resist pattern 6b used as a mask, the dry etching using the gas mixture of the chlorine gas ($Cl_2$) and the oxygen gas ($O_2$) (gas flow rate ratio $Cl_2:O_2=4:1$) was carried out to form the second pattern (light shielding pattern 3b) on the light-shielding film 3 (see FIG. 2F).

Furthermore, the resist pattern 6b was removed and, through the predetermined treatment such as cleaning, the phase shift mask 200 was obtained (see FIG. 2G).

The transfer mask 200 (halftone phase shift mask) thus manufactured was subjected to defect inspection by a mask defect inspection device. As a result, it has been confirmed that both of CD accuracy and line edge roughness of the phase shift pattern 2a satisfy required levels.

[Evaluation of Pattern Transfer Performance]

Using AIMS 193 (manufactured by Carl Zeiss), the phase shift mask 200 manufactured through the above-mentioned steps was subjected to simulation of a transfer image at the time when exposure transfer was carried out on a resist film on a semiconductor device by exposure light having a wavelength of 193 nm. An exposure transfer image in the simulation was verified and sufficiently satisfied design specifications. From this result, it is said that, even if the phase shift mask 200 of Example 1 is set to a mask stage of an exposure apparatus and transfer by exposure is carried out on the resist film on the semiconductor device, a circuit pattern finally formed on the semiconductor device can be formed with high accuracy.

Comparative Example 1

[Manufacture of Mask Blank]

In Comparative Example 1, manufacture of a mask blank and manufacture of a transfer mask were carried out with the hard mask film 4 in which the content ratio (atomic %) of silicon (Si) and oxygen (O) is Si:O=1:2 ($SiO_2$ film which is not oxygen-deficient). Except characteristics of the hard mask film 4 and a film forming method, Comparative Example 1 is same as Example 1. Hereinafter, different points from Example 1 will be described.

After the films up to and including the light-shielding film 3 were formed through the steps similar to those in Example 1, RF sputtering was carried out using a silicon (Si) target and an argon (Ar) gas and an oxygen ($O_2$) gas as a sputtering gas to form the hard mask film 4 of silicon and oxygen having a thickness of 15 nm on the light-shielding film 3. The hard mask film thus formed had a composition of Si:O=1:2 (atomic % ratio). The composition was measured by XPS.

It has been found out that, as will later be described, the hard mask film 4 has a low etching rate for the fluorine-based gas as compared with Example 1 and the hard mask film cannot be said to be rapidly and excellently etched.

It has been found out that the hard mask film 4 has a tendency that the density of the film is relatively high (high density) and the content ratio (atomic %) of silicon (Si) and oxygen (O) is Si:O=1:2 ($SiO_2$ film which is not oxygen-deficient).

An Si2p narrow spectrum, an N1s narrow spectrum, and an O1s narrow spectrum of the mask blank of Comparative Example 1 were obtained through the steps similar to those in Example 1, respectively. From the result of the Si2p narrow spectrum (not shown), it has been found out that the hard mask film 4 in Comparative Example 1 has a maximum peak at a binding energy (103.8 eV) exceeding 103.5 eV. This result means that an existence ratio of Si—O bonds is very high. From the result of the Si2p narrow spectrum (not shown), it has been found out that the hard mask film 4 in Comparative Example 1 has a substantially flat waveform at a binding energy between 97 and 100 eV and has no peak (below a detection lower limit value). This result means that no Si—Si bonds were not detected from the hard mask film 4.

From the result of the N1s narrow spectrum (not shown), it has been found out that the hard mask film 4 in Comparative Example 1 has a maximum peak below a detection lower limit value. This result means that atoms bonded to nitrogen, including Si—N bonds, were not detected in the hard mask film 4 in Comparative Example 1.

As described above, in the hard mask film 4 in Comparative Example 1, the content ratio of silicon (Si) and oxygen (O) is Si:O=1:2 so that the above-mentioned condition 1 is not satisfied. The Si2p narrow spectrum has the maximum peak at the binding energy (103.8 eV) exceeding 103.5 eV so that the above-mentioned condition 2 is not satisfied also. In the hard mask film 4 in Comparative Example 1, the maximum peak of the N1s narrow spectrum is below the detection lower limit value so that only the above-mentioned condition 3 is satisfied.

From the result of the O1s narrow spectrum (not shown), it has been found out that the hard mask film 4 in Comparative Example 1 has a maximum peak at a binding energy between 532 and 533 eV. The result means that a highly oxidized substance (Si—O bonds) is present at least at a certain ratio or more.

[Manufacture of Phase Shift Mask]

Next, using the mask blank 100 in Comparative Example 1, the halftone phase shift mask 200 was manufactured in the manner similar to Example 1. At first, the surface of the hard mask film 4 was subjected to HMDS treatment.

Next, in the manner similar to Example 1, the resist pattern 5a having the first pattern was formed (see FIG. 2A).

Next, dry etching using the resist pattern 5a as a mask and using a $CF_4$ gas was carried out to form the first pattern (hard mask pattern 4a) on the hard mask film 4 (see FIG. 2B).

Then, it has been found out that the hard mask film 4 has a low etching rate for the fluorine-based gas as compared with Example 1 and the hard mask film cannot be said to be rapidly etched with high accuracy.

The etching rate of the hard mask film 4 was calculated from the film thickness and the etching time of the hard mask film 4. As a result, the etching rate for the fluorine-based gas is relatively small as compared with the hard mask film 4 of Example 1 mentioned above.

The hard mask pattern 4a was observed by the scanning electron microscope (SEM). As a result, the surface of the side wall was not smooth as compared with Example 1.

Next, the resist pattern 5a was removed. Subsequently, dry etching (high-bias etching with an electric power of 50 [W] when a bias voltage was applied) using the hard mask pattern 4a as a mask and using a gas mixture of a chlorine gas ($Cl_2$) and an oxygen gas ($O_2$) (gas flow rate ratio $Cl_2:O_2=13:1$) was carried out to form the first pattern (light-shielding pattern 3a) on the light-shielding film 3 (see FIG. 2C). At this time, over-etching was performed in the manner similar to Example 1.

The hard mask pattern 4a after the end of the over-etching was observed by the scanning electron microscope (SEM). As a result, the edge between the sidewall and the surface of the pattern was sharp (no rounded corner). The surface of the sidewall of the hard mask pattern 4a was not smooth.

Thereafter, under the conditions same as those in Example 1 and through the steps similar to those in Example 1, the transfer mask 200 (halftone phase shift mask) was manufactured.

The manufactured transfer mask 200 (halftone phase shift mask) in Comparative Example 1 was subjected to mask defect inspection by the mask defect inspection device. As a result, it has been revealed that both of CD accuracy and line edge roughness of the phase shift pattern 2a do not satisfy required levels.

Comparative Example 2

[Manufacture of Mask Blank]

In Comparative Example 2, the hard mask film 4 was formed of a material having a relatively high existence ratio of Si—Si bonds, and manufacture of a mask blank and manufacture of a transfer mask were carried out. Except the material of the hard mask film 4 and the film-forming method, Comparative Example 2 is same as those in Example 1. Hereinafter, different points from Example 1 will be described.

Through the steps similar to those in Example 1, the films up to and including the light-shielding film 3 were formed. Thereafter, using a silicon (Si) target, sputtering was carried out using oxygen ($O_2$) and an argon (Ar) gas as a sputtering gas to form the hard mask film 4 comprising an $SiO_2$ film having a thickness of 15 nm on the light-shielding film 3. The hard mask film 4 in Comparative Example 2 had a composition of Si:O=38.5:61.5 (atomic % ratio). The composition was measured by XPS.

Through the steps similar to those in Example 1, an Si2p narrow spectrum, an N1s narrow spectrum, and an O1s narrow spectrum of the mask blank in Comparative Example 2 were obtained, respectively. From the result of the Si2p narrow spectrum (not shown), it has been found out that the hard mask film 4 in Comparative Example 2 has peaks at a binding energy (99.2 eV) between at least 97 eV and at most 100 eV and at a binding energy (102.7 eV) less than 103 eV, respectively.

Furthermore, as regards the hard mask film 4 in Comparative Example 2, it has also been found out that, in the Si2p narrow spectrum, an integrated intensity of Si—Si bonds ranges from at least half of an integrated intensity of Si—O bonds to a level equivalent thereto and both the Si—O bonds and the Si—Si bonds are present in significant proportions.

[Manufacture of Phase Shift Mask]

Next, using the mask blank 100 in Comparative Example 2, the halftone phase shift mask 200 was manufactured in the manner similar to Example 1. At first, a surface of the hard mask film 4 was subjected to HMDS treatment.

Next, in the manner similar to Example 1, the resist pattern 5a having the first pattern was formed (see FIG. 2A).

Next, dry etching using the resist pattern 5a as a mask and using a $CF_4$ gas was carried out to form the first pattern (hard mask pattern 4a) on the hard mask film 4 (see FIG. 2B).

At this time, the hard mask film 4 was higher in etching rate for the fluorine-based gas than the hard mask film 4 in Example 1. Thus, it has been found out that the hard mask film 4 can be rapidly etched with high accuracy.

Next, the resist pattern 5a was removed. Subsequently, dry etching (high-bias etching with an electric power of 50 [W] when a bias voltage was applied) using the hard mask pattern 4a as a mask and using a gas mixture of a chlorine gas ($Cl_2$) and an oxygen gas ($O_2$) (gas flow rate ratio $Cl_2:O_2=13:1$) was carried out to form the first pattern (light-shielding pattern 3a) on the light-shielding film 3 (see FIG. 2C). At this time, over-etching was performed in the manner similar to Example 1.

The hard mask pattern 4a after the end of the over-etching was observed by the scanning electron microscope (SEM). As a result, the edge between the sidewall and the surface of the pattern had a rounded corner. The surface of the sidewall of the hard mask pattern 4a was not smooth. Thus, it has been found out that the function as the hard mask tends to considerably decline (etching resistance against the chlorine-based gas is significantly decreased, in particular, the etching resistance is further significantly decreased under the high-bias etching condition). Therefore, the light-shielding pattern 3a processed by dry etching using the hard mask pattern 4a as a mask was degraded in CD accuracy and line edge roughness. Furthermore, the phase shift pattern 2a processed by dry etching using the light-shielding pattern 3a as a mask was also degraded in CD accuracy and line edge roughness.

Thereafter, under the conditions same as those in Example 1 and through the steps similar to those in Example 1, the transfer mask 200 (halftone phase shift mask) was manufactured.

The manufactured transfer mask 200 (halftone phase shift mask) in Comparative Example 2 was subjected to mask defect inspection. As a result, it has been found out that both of the CD accuracy and the line edge roughness of the phase shift pattern 2a do not satisfy required levels.

Although this disclosure has been described in detail in connection with a plurality of embodiments and examples, the technical scope of this disclosure is not limited to the embodiments and the examples described above and various modifications may be made within the scope not deviating from the gist of this disclosure.

DESCRIPTION OF REFERENCE SYMBOLS 1 transparent substrate
2 phase shift film
2a phase shift pattern
3 light-shielding film
3a, 3b light-shielding pattern
4 hard mask film
4a hard mask pattern
5a resist pattern
6b resist pattern
11 substrate
12 multilayer reflective film
13 protective film
14 absorber film (phase shift film)
15 hard mask film
16 rear conductive film
100 mask blank
200 phase shift mask (transfer mask)
300 reflective mask blank
400 reflective mask

What is claimed is:

1. A mask blank comprising:
a substrate:
a multilayer reflective film being able to reflect EUV light on the substrate;
an absorber film on the multilayer reflective film, the absorber film containing ruthenium; and
a hard mask film on the absorber film;
wherein the hard mask film consists of silicon and oxygen;
wherein an Si2p narrow spectrum, obtained by analyzing the hard mask film by X-ray photoelectron spectroscopy, has a maximum peak at a binding energy of at least 103 eV;
wherein an N1s narrow spectrum, obtained by analyzing the hard mask film by X-ray photoelectron spectroscopy, has a maximum peak below a detection lower limit value; and
wherein, in the hard mask film, a content ratio (atomic %) of silicon and oxygen is Si:O=1:less than 2,
wherein an oxygen content of the hard mask film is at least 60 atomic % and at most 65.5 atomic %.

2. The mask blank according to claim 1, wherein an O1s narrow spectrum, obtained by analyzing the hard mask film by X-ray photoelectron spectroscopy, has a maximum peak at a binding energy of at least 532 eV.

3. The mask blank according to claim 1, wherein an O1s narrow spectrum, obtained by analyzing the hard mask film by X-ray photoelectron spectroscopy, has a maximum peak at a binding energy of less than 533 eV.

4. The mask blank according to claim 1, wherein a difference is at most 0.2 eV between:
a first binding energy at which a maximum peak is present in an Si2p narrow spectrum obtained by analyzing a surface of the hard mask film by X-ray photoelectron spectroscopy, and
a second binding energy at which a maximum peak is present in an Si2p narrow spectrum obtained by analyzing an inside of the hard mask film by X-ray photoelectron spectroscopy.

5. The mask blank according to claim 1, wherein a difference is at most 0.1 eV between:
a first binding energy at which a maximum peak is present in an O1s narrow spectrum obtained by analyzing a surface of the hard mask film by X-ray photoelectron spectroscopy, and
a second binding energy at which a maximum peak is present in an O1s narrow spectrum obtained by analyzing an inside of the hard mask film by X-ray photoelectron spectroscopy.

6. The mask blank according to claim 1, wherein the Si2p narrow spectrum has no peak at a binding energy in a range of at least 97 eV and at most 100 eV.

7. The mask blank according to claim 1, wherein the absorber film contains at least one element selected from chromium, tantalum, nickel, and cobalt.

8. The mask blank according to claim 1, wherein the absorber film can be etched with a chlorine-containing gas.

9. The mask blank according to claim 8, wherein a protective film is provided between the multilayer reflective film and the absorber film.

10. The mask blank according to claim 1, wherein the protective film contains ruthenium.

11. A method for manufacturing a transfer mask by using the mask blank according to claim 1, the method comprising:
forming a transfer pattern on the hard mask film by dry etching using a fluorine-based gas and using, as a mask, a resist film formed on the hard mask film and having the transfer pattern; and
forming the transfer pattern on the absorber film by dry etching using a chlorine-containing gas and using, as a mask, the hard mask film with the transfer pattern formed thereon.

12. The method according to claim 11, wherein the chlorine-containing gas is an oxygen-containing chlorine-based gas having a ratio of chlorine-based gas to oxygen gas of at least 10:1, and
wherein the dry etching using the chlorine-containing gas is carried out under a condition where a high bias voltage is applied.

13. The method according to claim 11, wherein the chlorine-containing gas is an oxygen-free chlorine-based gas, and
wherein the dry etching using the chlorine-containing gas is carried out under a condition where a high bias voltage is applied.

14. A method for manufacturing a semiconductor device, comprising using the transfer mask manufactured by the method according to claim 11 and transferring by exposure the transfer pattern to a resist film on a substrate to be provided with a semiconductor device.

* * * * *